(12) United States Patent
Komori et al.

(10) Patent No.: US 7,936,228 B2
(45) Date of Patent: May 3, 2011

(54) FREQUENCY MODULATOR AND FM TRANSMISSION CIRCUIT USING THE SAME

(75) Inventors: Hirofumi Komori, Kyoto (JP); Takeshi Sagara, Kyoto (JP)

(73) Assignee: Rohm Co., Ltd. (JP)

( * ) Notice: Subject to any disclaimer, the term of this patent is extended or adjusted under 35 U.S.C. 154(b) by 400 days.

(21) Appl. No.: 12/096,528

(22) PCT Filed: Dec. 5, 2006

(86) PCT No.: PCT/JP2006/324292
§ 371 (c)(1),
(2), (4) Date: Jun. 6, 2008

(87) PCT Pub. No.: WO2007/066672
PCT Pub. Date: Jun. 14, 2007

(65) Prior Publication Data
US 2010/0213916 A1    Aug. 26, 2010

(30) Foreign Application Priority Data

Dec. 6, 2005  (JP) .................. 2005-352715
Dec. 8, 2005  (JP) .................. 2005-354733
Dec. 14, 2005 (JP) .................. 2005-360566
Dec. 14, 2005 (JP) .................. 2005-360968
Dec. 15, 2005 (JP) .................. 2005-361795

(51) Int. Cl.
*H04H 20/48* (2008.01)
*H03C 3/00* (2006.01)

(52) U.S. Cl. ............ 332/119; 381/3; 381/14; 455/66.1
(58) Field of Classification Search ............ 332/119, 332/117; 455/66.1; 381/3, 14
See application file for complete search history.

(56) References Cited

U.S. PATENT DOCUMENTS

| | | | | |
|---|---|---|---|---|
| 4,236,042 A | * | 11/1980 | Leitch | 381/16 |
| 4,520,498 A | * | 5/1985 | Hershberger | 381/16 |
| 4,782,531 A | * | 11/1988 | Karr et al. | 381/14 |
| 6,178,317 B1 | * | 1/2001 | Kroeger et al. | 455/296 |
| 7,224,302 B2 | * | 5/2007 | Dornbusch | 341/143 |

(Continued)

FOREIGN PATENT DOCUMENTS

CN    2324710 Y    9/1999

(Continued)

OTHER PUBLICATIONS

Office Action for Japanese Patent Application No. 2005-360566 mailed Feb. 2, 2010 with English translation.

(Continued)

*Primary Examiner* — Joseph Chang
(74) *Attorney, Agent, or Firm* — Cantor Colburn LLP

(57) ABSTRACT

An input signal is input via a first resistor to an inverting input terminal of an operational amplifier. A second resistor is provided on a feedback path between an output terminal and the inverting input terminal of the operational amplifier. A control voltage Vcnt output from the operational amplifier is input to a VCO. A frequency divider frequency-divides an output signal Sout of the VCO. A phase comparator compares an output signal from the frequency divider with a reference clock signal and outputs a voltage according to a phase difference. A loop filter removes a high-frequency component of an output voltage Vcp of the phase comparator and outputs the voltage to a non-inverting input terminal of the operational amplifier.

11 Claims, 18 Drawing Sheets

U.S. PATENT DOCUMENTS

| | | | |
|---|---|---|---|
| 7,474,707 B2 * | 1/2009 | Kroeger | 375/296 |
| 7,667,553 B2 * | 2/2010 | Sagara | 332/127 |
| 2007/0237333 A1 * | 10/2007 | Sagara | 381/7 |

FOREIGN PATENT DOCUMENTS

| | | |
|---|---|---|
| JP | 52-119054 | 10/1977 |
| JP | 54-59004 A | 5/1979 |
| JP | 56-83944 U | 7/1981 |
| JP | 57-44350 A | 3/1982 |
| JP | 58-105631 | 6/1983 |
| JP | 58-182309 | 10/1983 |
| JP | 61-201505 | 9/1986 |
| JP | 1-106507 | 4/1989 |
| JP | 3-23717 | 1/1991 |
| JP | 4-38122 A | 2/1992 |
| JP | H4-76711 | 7/1992 |
| JP | 5-114291 A | 5/1993 |
| JP | 5-130059 | 5/1993 |
| JP | 5-175922 | 7/1993 |
| JP | 5-218747 | 8/1993 |
| JP | 6-261012 A | 9/1994 |
| JP | 8-78966 | 3/1996 |
| JP | 8-330872 | 12/1996 |
| JP | 9-69729 | 3/1997 |
| JP | 9-190698 | 7/1997 |
| JP | 9-321720 | 12/1997 |
| JP | 10-107653 A | 4/1998 |
| JP | 11-88451 | 3/1999 |
| JP | 11-145855 A | 5/1999 |
| JP | 2000-349659 | 12/2000 |
| JP | 2005-102321 | 4/2005 |
| JP | 2007-103986 A | 4/2007 |

OTHER PUBLICATIONS

Chinese Office Action for Application No. 200680025569.7 issued Mar. 30, 2010 with English translation.

Japanese Office Action for Japanese Patent Application No. 2005-361795 dated May 12, 2009 with English translation.

International Preliminary Report on Patentability for International Application No. PCT/JP2006/324292 with English translation dated Jun. 11, 2008.

International Search Report for International Application No. PCT/JP2006/324292 mailed Mar. 13, 2007.

Office Action dated Apr. 1, 2008 for corresponding Japanese Patent Application No. 2005-354733 with English translation.

Office Action dated Mar. 6, 2007 for corresponding Japanese Patent Application No. 2005-360968 with English translation.

Office Action dated Apr. 1, 2008 for corresponding Japanese Patent Application No. 2005-360968 with English translation.

Japanese Office Action for Japanese Patent Application No. 2005-352715 mailed Sep. 9, 2008 with English Translation.

Japanese Office Action for Japanese Patent Application No. 2005-354733 mailed Sep. 9, 2008 with English Translation.

Office Action for Japanese Patent Application No. 2005-352715 mailed Oct. 20, 2009 with English translation.

* cited by examiner

FREQUENCY MODULATOR AND FM TRANSMISSION CIRCUIT USING THE SAME

CROSS REFERENCE TO RELATED APPLICATIONS

This is a U.S. national stage of application No. PCT/JP2006/324292, filed on 5 Dec. 2006. Priority under 35 U.S.C. §119(a) and 35 U.S.C. §365(b) is claimed from Japanese Application No. 2005-352715, filed 6 Dec. 2005, Japanese Application No. 2005-354733, filed 8 Dec. 2005, Japanese Application No. 2005-360566, filed 14 Dec. 2005, Japanese Application No. 2005-360968, filed 14 Dec. 2005, and Japanese Application No. 2005-361795, filed 15 Dec. 2005, the disclosures of which are also incorporated herein by reference.

BACKGROUND OF THE INVENTION

1. Field of the Invention

The present invention relates to a direct-modulation frequency modulator using a PLL (Phase Locked Loop).

2. Description of the Related Art 1, 3, 4. A frequency modulator, which generates a modulated signal frequency-modulated based on an audio signal (to be modulated) to be transmitted, is used in FM broadcast and in-car audio systems. For example, a patent document 1 discloses a direct-modulation frequency modulator that includes a PLL configured using a voltage controlled oscillator (hereinafter, referred to as a VCO), a frequency divider, a phase comparator, and a loop filter and multiplexes an audio signal as a modulating signal with an input signal to the VCO.

As disclosed in patent document 1, in the conventional direct-modulation frequency modulator, a technique, which couples the modulating signal using a coupling capacitor or a resistor for voltage addition between the output terminal of the loop filter and the input terminal of the VCO, has been adopted.

2. Further, a frequency modulator that generates a modulated signal frequency-modulated based on an audio signal (modulating signal) to be transmitted is used in FM broadcast and in-car audio systems. A stereo modulator, which converts a stereo audio signal containing a left-channel signal (hereinafter, also referred to as an L-channel signal) and a right-channel signal (hereinafter, also referred to as an R-channel signal) into a stereo composite signal using a subcarrier wave and a pilot signal, is provided upstream of the frequency modulator. For example, patent documents 2 to 4 disclose such stereo modulators.

5. When audio signal processing is performed, signal amplification is generally performed with the midpoint voltage between the power supply voltage and the ground potential as a reference voltage. As a voltage generating circuit for easily generating such a reference voltage, a circuit, which is provided with two voltage dividing resistors having the same resistance connected in series between the power supply terminal and the ground terminal for dividing the power supply voltage, is widely used. A patent document 5 discloses a related art.

[Patent Document 1] Japanese Patent Application Laid-open No. H9-69729
[Patent Document 2] Japanese Patent Application Laid-open No. 2005-102321
[Patent Document 3] Japanese Patent Application Laid-open No. H5-175922
[Patent Document 4] Japanese Patent Application Laid-open No. H5-130059
[Patent Document 5] Japanese Patent Application Laid-open No. H9-190698

1. However, conventionally, since the modulating signal is multiplexed (superimposed) with a high-frequency signal using a coupling capacitor and a resistor, there has been a problem that the impedance of the loop filter of the PLL has an influence on the input signal as the modulating signal. When the modulating signal is influenced by the loop filter, the modulating signal of the high-frequency range is attenuated and therefore, in the case where an audio signal is modulated, for example, distortion occurs in the signal. Further, the signal output from the loop filter may be leaked to the side of the circuit that generates the modulating signal.

2. As disclosed in the above described patent documents, in the stereo modulator, a sum signal of the L-channel signal and the R-channel signal (also referred to a main channel signal) and a difference signal of the L-signal and the R-signal (also referred to as a subchannel signal) are generated, and a subcarrier wave is amplitude-modulated using the subchannel signal. Then, the amplitude-modulated subcarrier wave and the main channel signal are multiplexed, a pilot signal is further multiplexed, and thereby, a stereo composite signal is generated.

As disclosed in patent document 2, in the FM stereo transmitter, the stereo composite signal output from the stereo modulator is input to the frequency modulator placed downstream. Here, typically, the subcarrier wave having a preset frequency of 38 kHz and the pilot signal having a preset frequency of 19 kHz are delayed differently by the VCO and the loop filter contained in the frequency modulator and filters provided between the respective circuit blocks, and therefore, there has been a problem that the separation characteristics are deteriorated.

In order to solve the problem, conventionally, phase delay and phase-lead may be corrected using a resistor and a capacitor, however, since a very large capacitor is required for changing the phase in the frequency range of 19 kHz and 38 kHz, it has been difficult to form as an IC. Further, if mounted as chip components, there has been a problem that adjustment with respect to each set is difficult.

3. The input-output characteristic, i.e., the relationship between the input voltage and the oscillation frequency of the VCO used for the direct-modulation frequency modulator is often nonlinear and the modulation sensitivity characteristic changes according to the frequency. As a result, when the amplitude of the modulating signal input to the frequency modulator is constant, the modulation degree may change according to the change of the frequency of the modulated signal and distortion may occur.

4. In the FM transmitter, the modulated signal output from the frequency modulator is amplified by a power amplifier and transmitted from an antenna to a receiver. Since the gain of the power amplifier has a frequency characteristic, in a conventional FM transmitter, there has been a problem that the transmission power is not constant depending on the frequency of the modulated signal (modulation frequency).

5. In this case, a capacitor having a large capacitance is generally provided between a voltage dividing point of the resistance and the ground so that the reference voltage may not vary even when the power supply voltage varies. The capacitor and the voltage dividing resistor configure a time constant circuit. In order to reduce the power consumption by the voltage dividing resistor, its resistance is set larger, accordingly the time constant of the time constant circuit formed with the capacitor and the voltage dividing resistor become very large. As a result, there has been a problem that the time, for charging the capacitor when the power supply is turned on, becomes long and then the time for raising the reference voltage becomes long.

SUMMARY OF THE INVENTION

The invention has been achieved in view of the above described problems.
1. A general purpose of an embodiment of the invention is to provide a frequency modulator capable of suppressing the influence of a loop filter of a PLL on the modulating signal.
2. Further, a general purpose of an embodiment of the invention is to provide a stereo modulator having an improved separation characteristic.
3. Further, a general purpose of an embodiment of the invention is to provide an FM transmission circuit capable of generating a good modulating signal in a wide frequency band.
4. Further, a general purpose of an embodiment of the invention is to provide an FM transmission circuit capable of obtaining constant transmission power in a wide frequency band.
5. A general purpose of an embodiment of the invention is to decrease a start-up time of a voltage generating circuit that divides a power supply voltage.
   1. A frequency modulator according to an embodiment of the invention includes: an operational amplifier having an inverting input terminal to which an input signal is input via a first resistor; a second resistor provided on a feedback path between an output terminal and the inverting input terminal of the operational amplifier; a voltage controlled oscillator to which an output signal from the operational amplifier is input; a frequency divider which frequency-divides an output signal from the voltage controlled oscillator; a phase comparator which compares an output signal from the frequency divider with a reference clock signal and outputs a voltage according to a phase difference; and a filter which removes a high-frequency component of an output voltage from the phase comparator and outputs the voltage to a non-inverting input terminal of the operational amplifier.

In this embodiment, the first resistor, the second resistor, and the operational amplifier function as an inverting amplifier for the input signal and function as a non-inverting amplifier for the output signal from the filter. Consequently, the input signal and the output signal from the filter are multiplexed by the operational amplifier and input to the voltage controlled oscillator. According to the embodiment, since the input impedance of the operational amplifier is high, the influence of the impedance of the filter on the circuit at the input terminal side to which the input signal is input can be reduced.

A resistance of the first resistor may be set higher than a resistance of the second resistor. In this case, the loop gain can be set lower while the input signal is attenuated.

At least one of the first and second resistors may be a variable resistor. In this case, the loop gain and the amplitude of the input signal can be adjusted according to the characteristic of the voltage controlled oscillator.

The operational amplifier may be a rail amplifier that can widely control the output voltage in a range from the ground voltage to the power supply voltage. In this case, since the voltage range of the input signal to the voltage controlled oscillator can be set wider, the frequency band of the high-frequency signal output from the frequency modulator can be taken wider.

The filter may be a passive filter. Further, the input signal may be a stereo composite signal.

The frequency modulator may be integrated on a single semiconductor substrate. "Integrated" includes the case where all of the component elements of the circuit are formed on a semiconductor substrate and the case where the main component elements of the circuit are integrated on a single substrate while some resistors and capacitors may be provided externally to the semiconductor substrate for adjustment of the circuit constant. The circuit area can be reduced by integrating the frequency modulator as one LSI.

Another embodiment of the invention is an FM transmission circuit using the above described frequency modulator. The FM transmission circuit includes: a stereo modulating unit which converts an audio signal into a stereo composite signal; the above described frequency modulator which performs frequency modulation on the stereo composite signal output from the stereo modulating unit; and an amplifier which amplifies the high frequency signal output from the frequency modulator.

2. An embodiment of the invention relates to a stereo modulator which generates a stereo composite signal based on a stereo signal, a subcarrier wave, and a pilot signal. The stereo modulator includes: a separation adjustment circuit which includes a delay circuit that delays an input signal by the time length, in which a predetermined clock signal is counted for n cycle (s), and inputs one of the subcarrier wave and the pilot signal to the delay circuit to be delayed; a multiplexer which multiplexes the subcarrier wave output from the separation adjustment circuit and the stereo signal; and a pilot signal multiplexing unit which multiplexes the pilot signal output from the separation adjustment circuit and an output signal from the multiplexer.

Given that the cycle of the clock signal is Tck, the delay of Tck×n is provided to the signal input to the delay circuit. According to the embodiment, the subcarrier wave or the pilot signal is delayed using the clock signal and the difference between the respective amounts of delay of the respective signals (i.e., the phase difference), which is given in the system equipped with the stereo modulator, is cancelled and therefore, a signal having an advantage in separation characteristic can be output.

The amount of shift by the separation adjustment circuit may be externally controllable. Since the difference between the amounts of delay of the subcarrier wave and the pilot signal change according to the configuration of the peripheral circuits, the separation characteristic can be further improved by adjusting the amount of shift according to the peripheral circuits.

The delay circuit of the separation adjustment circuit may include a first shift register that operates according to a clock signal, and output a signal n-bit shifted by the first shift register. Using the shift register that shifts one bit for each clock, a signal delayed by a predetermined number of clocks can be generated.

The delay circuit of the separation adjustment circuit may include: a first shift register capable of shifting m bits at the maximum (m is an integral number that satisfies m≧n); and a selecting unit which selects an n-bit shifted signal from the first shift register and outputs the signal. In this case, the amount of delay provided to the signal by the first register can be arbitrarily adjusted in a range from 0 bit to m bits.

The separation adjustment circuit may further include a switch which switches either one of the subcarrier wave and the pilot signal is input to the delay circuit.

Depending on the system configurations, both cases where the phase of the subcarrier wave delays and where the phase of the pilot signal delays are conceivable. According to the embodiment, both cases can be accommodated because which one of the subcarrier wave or the pilot signal to be delayed can be selected.

The separation adjustment circuit may further include a one-bit second shift register which delays an input signal by one clock cycle of the clock signal, and input the other of the subcarrier wave and the pilot signal to the second shift register to be delayed. In this case, the amounts of delay of the subcarrier wave and the pilot signal can be accurately set to a constant number multiple of the cycle of the clock signal.

The separation adjustment circuit may further include a switch which switches either one of the subcarrier wave and the pilot signal is input to the first shift register and the second shift register, respectively.

The clock signal may be a signal that shares the common origin with a reference clock signal used for generating the subcarrier wave and the pilot signal.

The stereo modulator may be integrated on a single semiconductor substrate. The circuit area can be reduced by integrating the stereo modulator as one LSI.

Another embodiment of the invention is an FM transmission circuit. The FM transmission circuit includes: the above described stereo modulator which converts an audio signal into a stereo composite signal; a frequency modulator which outputs a modulated signal frequency-modulated using the stereo composite signal output from the stereo modulator; and a power amplifier which amplifies the modulated signal generated by the frequency modulator. The stereo modulator, the frequency modulator, and the power amplifier may be integrated on a single semiconductor substrate.

According to the embodiment, the high-frequency signal frequency-modulated using the stereo composite signal that has an advantage in separation characteristic, and the sound quality can be improved.

3. An FM transmission circuit according to an embodiment of the invention includes: a variable gain amplifier which amplifies an input signal so as to adjust an amplitude thereof; a direct-modulation frequency modulator which uses an output signal from the variable gain amplifier as a modulating signal and generates a modulated signal frequency-modulated based on the modulating signal; and a gain control unit which sets a gain of the variable gain amplifier depending on a frequency of the modulated signal generated by the frequency modulator.

Here, "amplification" includes the case where the gain is one or less, and "amplifier" includes an attenuator. According to the embodiment, the amplitude of the input signal can be adjusted depending on a frequency, and therefore, a good modulated wave can be generated in a wide frequency band.

The gain control unit may set the gain of the variable gain amplifier so as to correct the frequency dependency of modulation sensitivity of the frequency modulator. When the frequency dependency of modulation sensitivity of the frequency modulator is large, a good modulated wave can be generated in a wide frequency band by adjusting the amplitude of the input signal as the modulating signal so that the frequency dependency may be cancelled.

The gain control unit may include a memory which stores a table showing a relationship between the frequency of the modulated signal and the gain of the variable gain amplifier. The relationship between the gain and the frequency is stored in a memory such as a ROM (Real Only Memory) or register, and thereby, accurate gain setting can be realized.

The frequency modulator may include: a voltage controlled oscillator; a frequency divider which frequency-divides an output signal from the voltage controlled oscillator; a phase comparator which compares an output signal from the frequency divider with a reference clock signal and outputs a voltage according to a phase difference; a filter which removes a high-frequency component of an output voltage from the phase comparator; and a multiplexing circuit which multiplexes the output signal from the variable gain amplifier with an output signal from the filter.

The multiplexing circuit may include: an operational amplifier having a non-inverting input terminal to which the output signal from the filter is input; a first resistor having one end connected to an inverting input terminal of the operational amplifier and the other end to which the input signal is input; and a second resistor provided on a feedback path between an output terminal and the inverting input terminal of the operational amplifier. The input signal may be a stereo composite signal.

The FM transmission circuit may be integrated on a single semiconductor substrate. The circuit area can be reduced by integrating the FM transmission circuit as one LSI.

The above described FM transmission circuit may further include: a stereo modulating unit which converts an audio signal into a stereo composite signal and outputs the signal to the variable gain amplifier; and a power amplifier which amplifies the modulated signal generated by the frequency modulator, and wherein the FM transmission circuit may be integrated on a single semiconductor substrate. By configuring the peripheral circuits integrated on a single semiconductor substrate, the number of interconnections and pins can be reduced and the mixing of noise can be prevented, and therefore the sound quality can be improved.

4. An FM transmission circuit according to an embodiment of the invention includes: a direct-modulation frequency modulator which generates a modulated signal frequency-modulated based on a modulating signal; a power amplifier which amplifies the modulated signal generated by the frequency modulator; and a gain control unit which sets a gain of the power amplifier depending on a frequency of the modulated signal generated by the frequency modulator. The gain control unit may set the gain of the power amplifier depending on the frequency of the modulated signal so that power of a high-frequency signal output from the power amplifier may be constant.

According to the embodiment, the gain of the power amplifier can be adjusted depending on the frequency, and therefore the frequency dependency of the transmission power can be reduced.

The gain control unit may include a memory which stores a table showing a relationship between the frequency of the modulated signal and the gain of the power amplifier. The relationship between the gain and the frequency is stored in a memory such as a ROM (Real Only Memory) or register, and thereby, accurate gain setting can be realized.

The frequency modulator may include: a voltage controlled oscillator; a frequency divider which frequency-divides an output signal from the voltage controlled oscillator; a phase comparator which compares an output signal from the frequency divider with a reference clock signal and outputs a voltage according to a phase difference; a filter which removes a high-frequency component of an output voltage from the phase comparator; and a multiplexing circuit which multiplexes the modulating signal with an output signal from the filter.

The multiplexing circuit may include: an operational amplifier having a non-inverting input terminal to which the output signal from the filter is input; a first resistor having one end connected to an inverting input terminal of the operational amplifier and the other end to which the modulating signal is input; and a second resistor provided on a feedback path between an output terminal and the inverting input terminal of the operational amplifier. The modulating signal may be a stereo composite signal.

The FM transmission circuit may be integrated on a single semiconductor substrate. "Integrated" includes the case where all of the component elements of the circuit are formed on a semiconductor substrate and the case where the main component elements of the circuit are integrated on a single substrate wile some resistors and capacitors may be provided externally to the semiconductor substrate for adjustment of the circuit constant. The circuit area can be reduced by integrating the FM transmission circuit as one LSI.

The above described FM transmission circuit may further include: a stereo modulating unit which converts an audio signal into a stereo composite signal and outputs the signal to the frequency modulator; and a power amplifier which amplifies the modulated signal generated by the frequency modulator, and the FM transmission circuit may be integrated on a single semiconductor substrate. By configuring the peripheral circuits integrated on a single semiconductor substrate, the number of interconnections and pins can be reduced and the mixing of noise can be prevented, and therefore the sound quality can be improved.

An according embodiment of the invention relates to a voltage generating circuit which divides a power supply voltage applied to a power supply terminal and a ground voltage applied to a ground terminal and outputs a divided voltage from an output terminal. The voltage generating circuit includes: a first voltage divider circuit including first and second resistors connected in series between the power supply terminal and the ground terminal, a connection point between the two resistors is connected to the output terminal; an output capacitor provided between the output terminal and the ground terminal; a second voltage divider circuit including third and fourth resistors connected in series between the power supply terminal and the ground terminal; and a charging circuit which becomes active and supplies electric current to the output capacitor when a voltage at a connection point between the third and fourth resistors is higher than a voltage at the output terminal.

According to the embodiment, when the power supply voltage rises, the rising of the voltage at the output terminal delays from the rising of the power supply voltage, and therefore, the charging circuit becomes active. Consequently, charge is supplied to the output capacitor not only from the first resistor but also from the charging circuit, and the start-up time can be shortened.

The charging circuit may include: a first switch connected in series between the power supply terminal and the ground terminal; and a first comparator which compares the voltage at the connection point between the third and fourth resistors with the voltage at the output terminal. The first switch may be turned on and off according to an output signal from the first comparator.

The charging circuit may further include a fifth resistor connected in series to the first switch. A resistance of the fifth resistor may be set in a range from $1/1000$ times to $1/10$ times resistances of the first, second, third and fourth resistors.

By setting the resistance of the fifth resistor lower, the time constant can be set smaller and therefore the output voltage can be raised in a short time.

The first comparator may have an input offset voltage. By setting the offset voltage for the input of the first comparator, the turning of on and off of the first switch repeatedly due to slight variations in the power supply voltage and the output voltage can be prevented.

The voltage generating circuit may further include a discharging circuit which becomes active and draws current from the output capacitor when the voltage at the connection point between the third and fourth resistors is lower than the voltage at the output terminal.

In this case, the start-up time can be further shortened.

The discharging circuit may include: a second switch connected in series between the ground terminal and the output terminal; and a second comparator which compares the voltage at the connection point between the third and fourth resistors with the voltage at the output terminal, and the second switch may be turned on and off according to an output signal from the second comparator.

The discharging circuit may further include a sixth resistor connected in series to the second switch. A resistance of the sixth resistor may be set in a range from $1/1000$ times to $1/10$ times the resistances of the first, second, third, fourth resistors.

The second comparator may have an input offset voltage.

The first resistor and the second resistor of the first voltage divider circuit and the third resistor and the fourth resistor of the second voltage divider circuit may be formed by pairing, respectively.

Another embodiment of the invention is a signal processing circuit. The signal processing circuit includes the voltage generating circuit and performs predetermined signal processing using a voltage output from the voltage generating circuit as a reference voltage.

According to the embodiment, since the reference voltage rises immediately after the power supply voltage rises, the signal processing can be promptly started.

The above described signal processing circuit may include: a stereo modulator which converts an audio signal into a stereo composite signal; a frequency modulator which generates a modulated signal frequency-modulated using the stereo composite signal output from the stereo modulator; and a power amplifier which amplifies the modulated signal generated by the frequency modulator. At least one of the stereo modulator and the frequency modulator may operate according to a voltage output from the voltage generating circuit.

The signal processing circuit may be integrated on a single semiconductor substrate. The circuit area can be reduced by integrating the signal processing circuit as one LSI.

Note that arbitrary combinations of the above described component elements and mutual substitutions of the component elements and phrasings of the invention among methods, apparatuses, systems, and the like may be effective as embodiments of the invention.

EFFECT OF THE INVENTION

1. According to an embodiment of the invention, in the direct-modulation frequency modulator using the PLL, frequency modulation can be performed by multiplexing the modulating signal with the output signal from the loop filter.
2. With a stereo modulator according to an embodiment of the invention, the separation characteristic can be improved.
3. According to an embodiment of the invention, a good modulated signal can be generated in a wide frequency band.
4. With an FM transmission circuit according to an embodiment of the invention, constant transmission power can be obtained in a wide frequency band.

5. With a voltage generating circuit according to an embodiment of the invention, the start-up time can be shortened.

BRIEF DESCRIPTION OF THE DRAWINGS

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

Embodiments will now be described, by way of example only, with reference to the accompanying drawings which are meant to be exemplary, not limiting, and wherein like elements are numbered alike in several Figures, in which:

FIG. 1 is a circuit diagram showing a configuration of a frequency modulator according to a first embodiment;

FIG. 2 is a block diagram showing a configuration of an FM transmitter using the frequency modulator in FIG. 1;

FIG. 3 is a block diagram showing a configuration of an FM transmitter according to the second embodiment;

FIG. 4 is a circuit diagram showing a configuration of a stereo modulator according to the second embodiment of the invention and a peripheral circuit thereof;

FIG. 5 is a circuit diagram showing a first configuration example of the separation adjustment circuit;

FIG. 6 is a circuit diagram showing a second configuration example of the separation adjustment circuit;

FIG. 7 is a circuit diagram showing a third configuration example of the separation adjustment circuit;

FIG. 8 is a circuit diagram showing a fourth configuration example of the separation adjustment circuit;

FIG. 9 is a block diagram showing a configuration of an FM transmitter according to the third embodiment;

FIG. 10 is a circuit diagram showing a preferred configuration of the frequency modulator according to the third embodiment;

FIG. 11 shows an example of modulation sensitivity characteristic of the frequency modulator using the VCO shown in FIG. 10;

Figure 12:
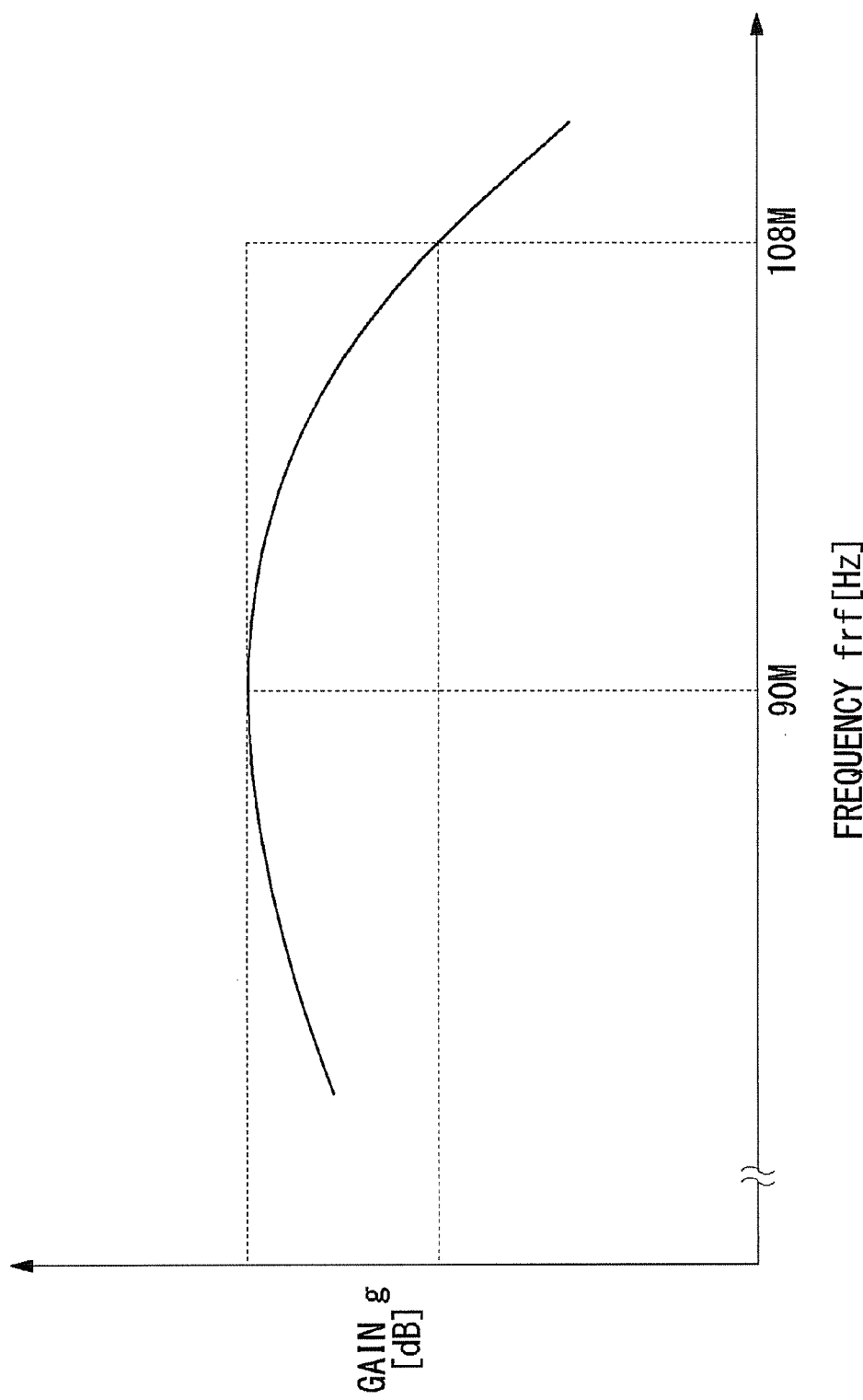
Figure 13:
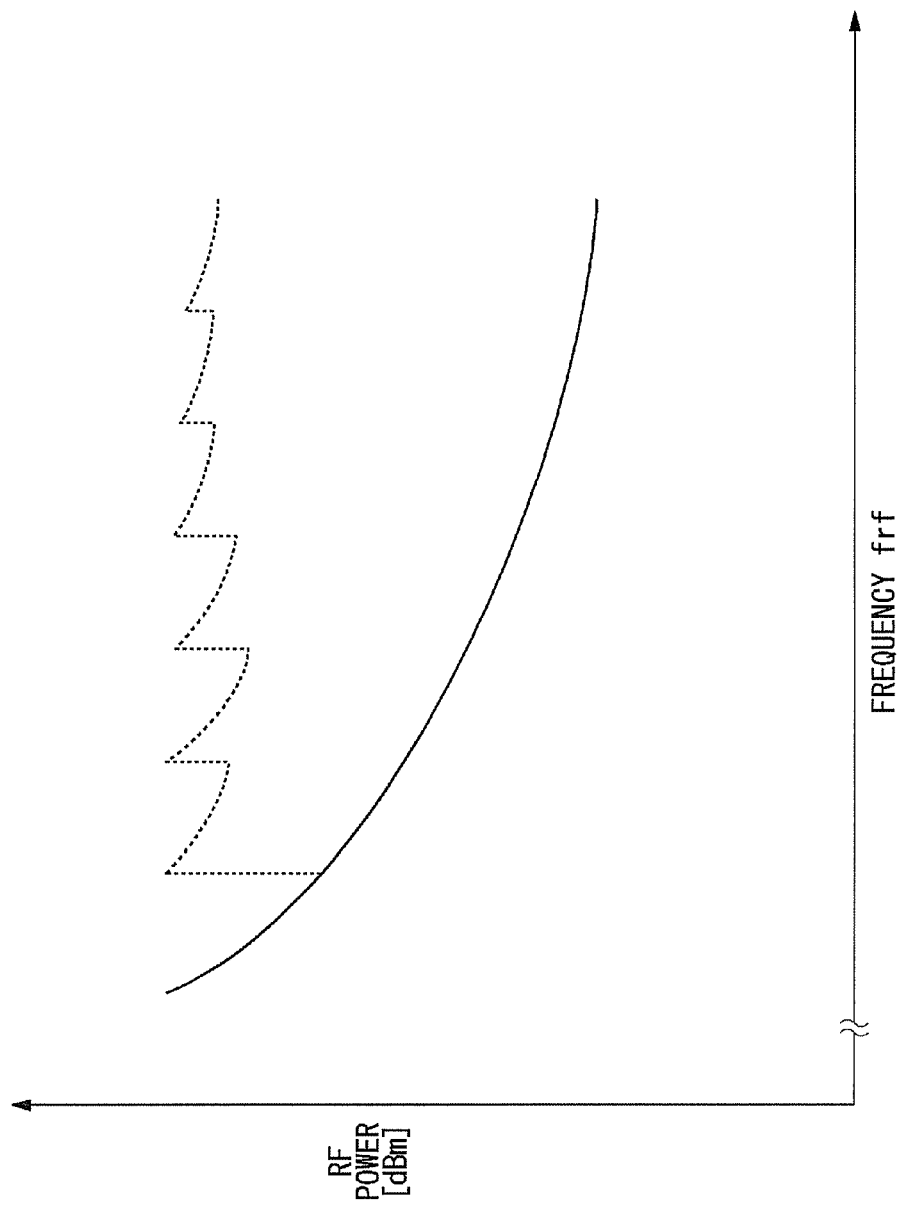
Figure 14:
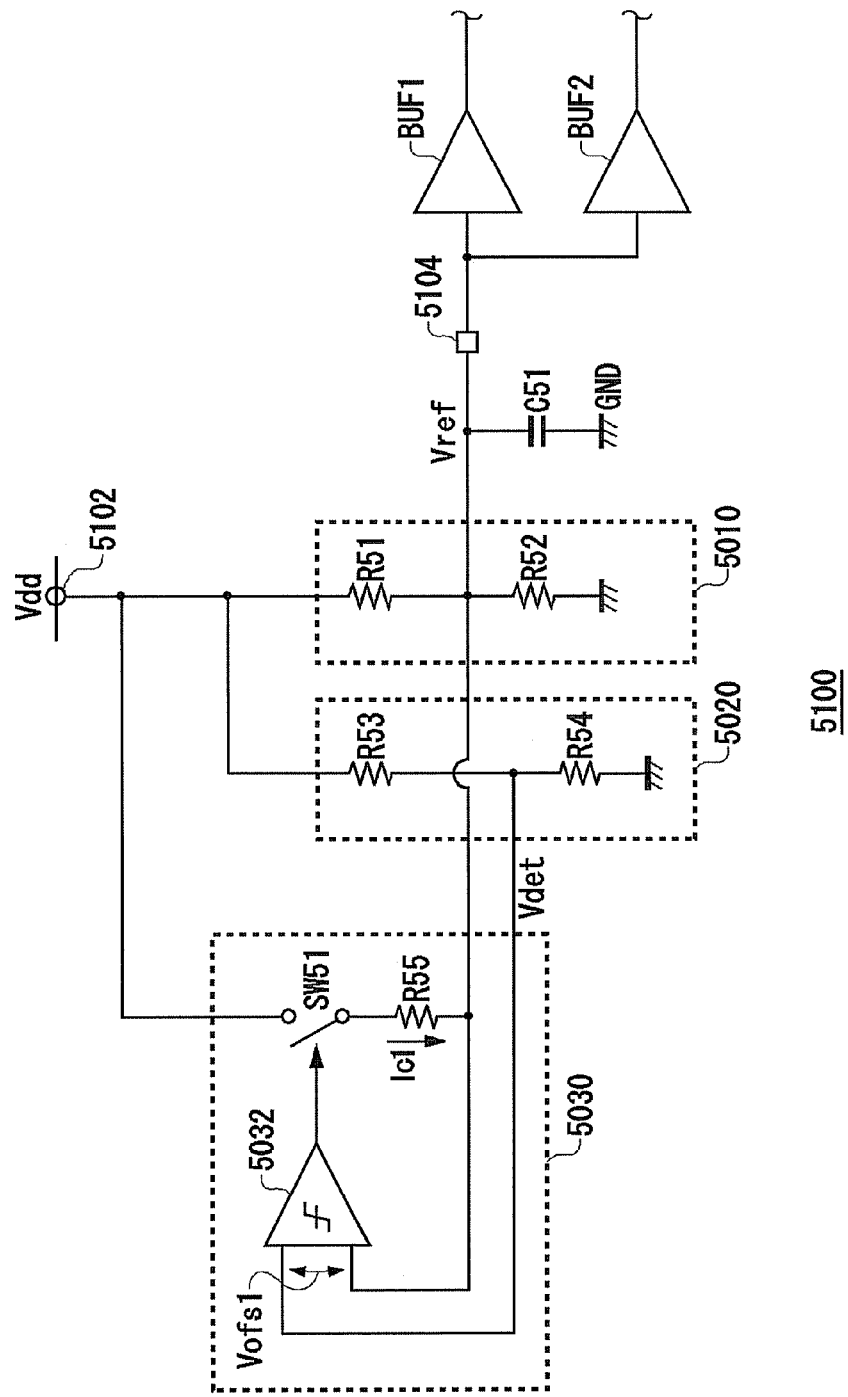
Figure 15:
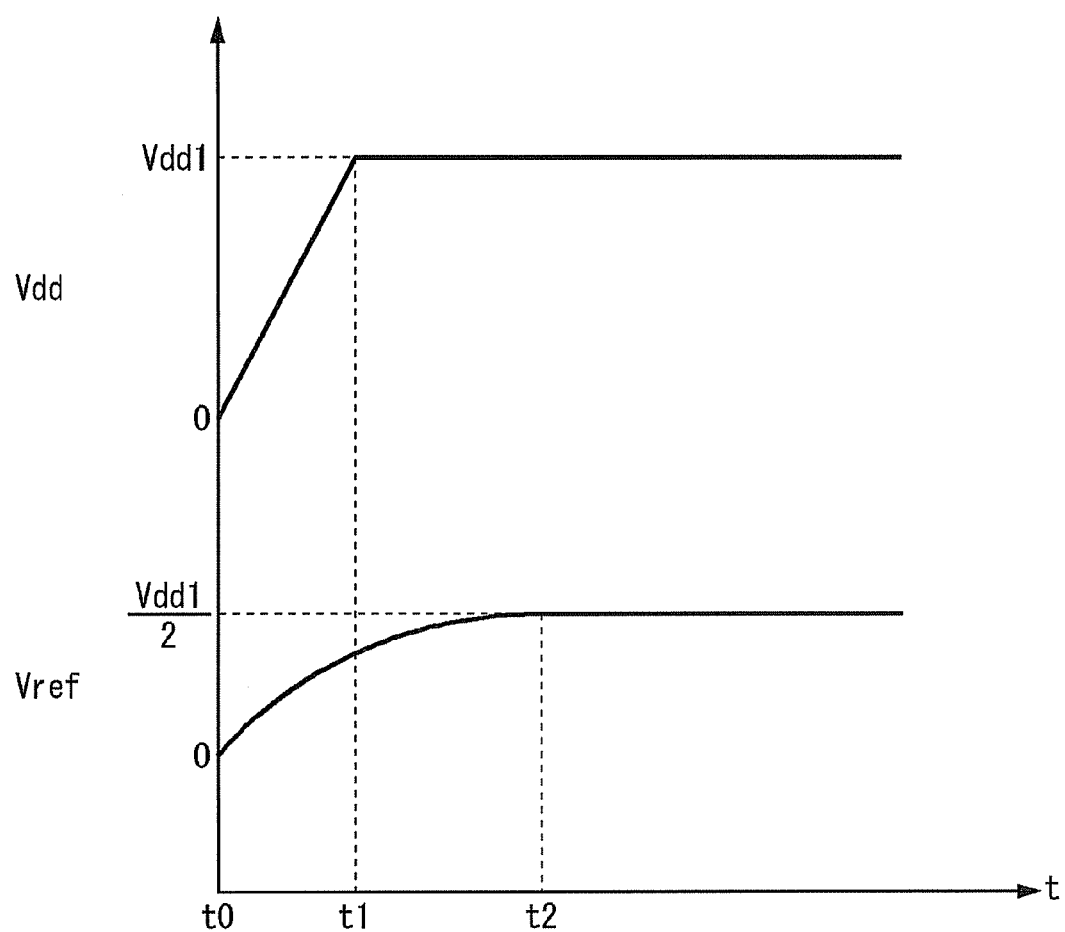
Figure 16:
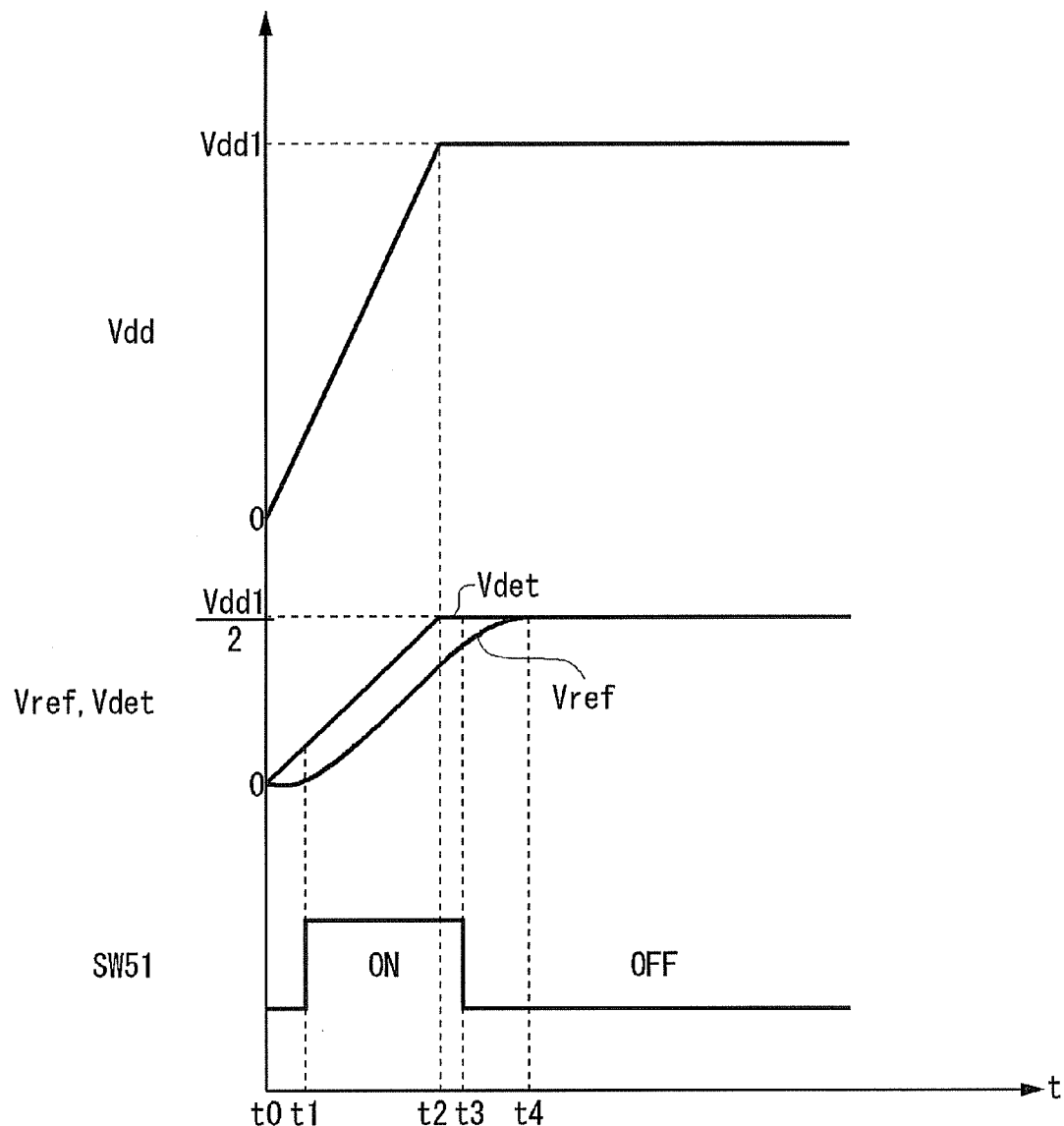
Figure 17:
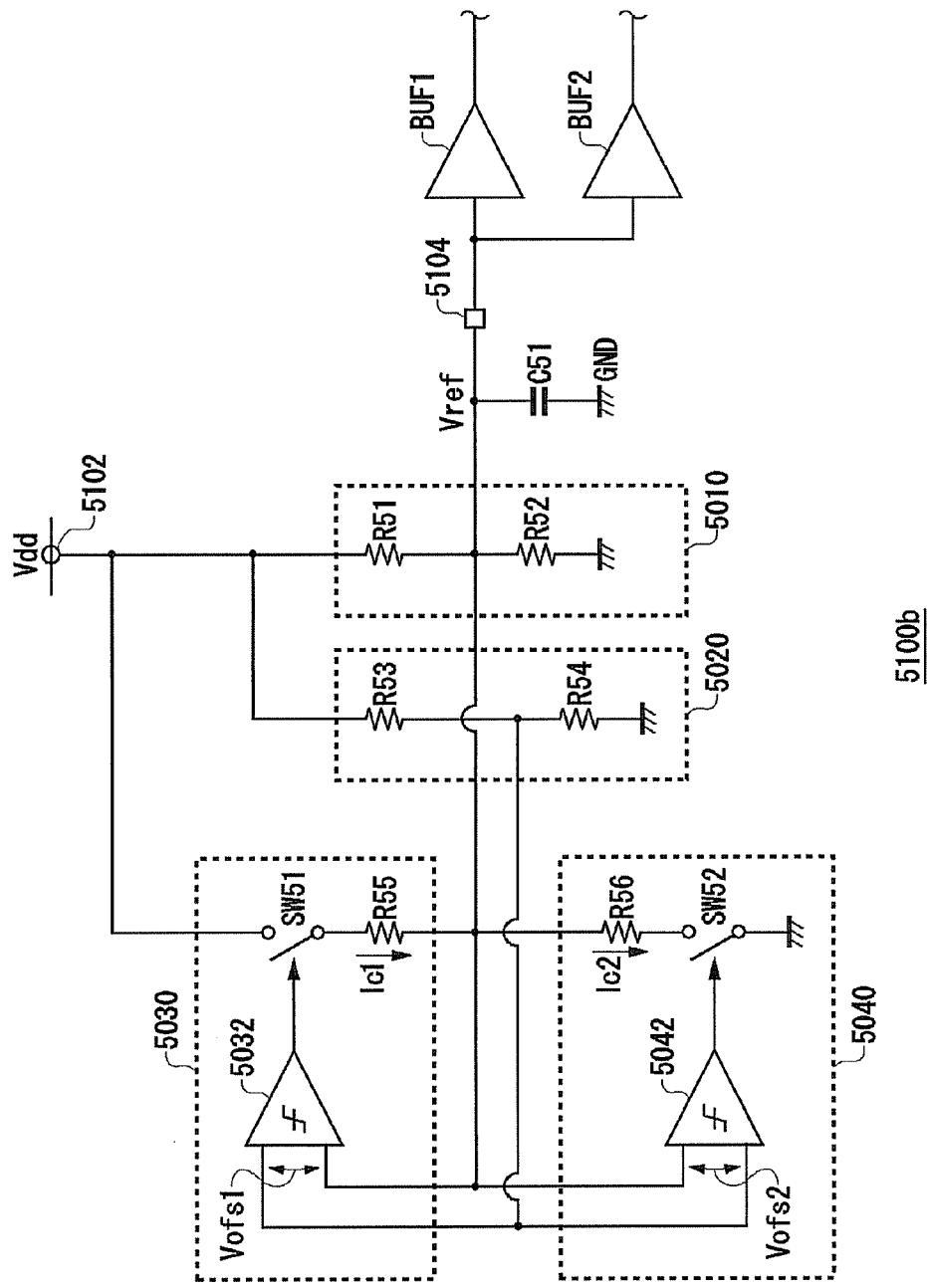
Figure 18:
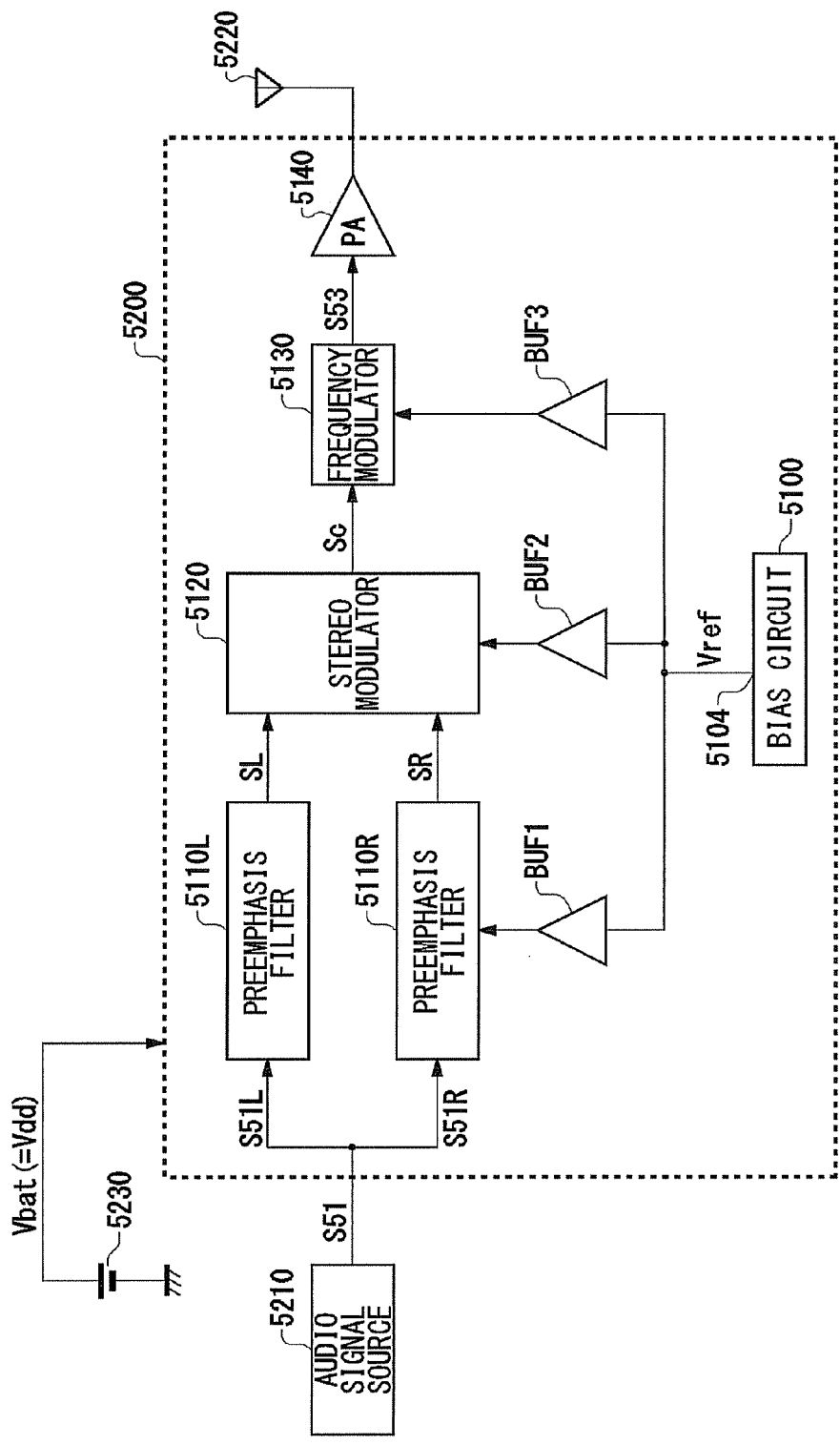

FIG. 12 shows a relationship between the gain of the variable gain amplifier set by the control unit and the modulation frequency;

FIG. 13 shows a relationship between the output power and the frequency of the FM transmitter;

FIG. 14 is a circuit diagram showing a configuration of a voltage generating circuit according to the fourth embodiment;

FIG. 15 is an operation waveform chart of the voltage generating circuit when the charging circuit is not provided;

FIG. 16 is an operation waveform chart of the voltage generating circuit in FIG. 14 provided with a charging circuit;

FIG. 17 is a circuit diagram showing a configuration of the modified example of the voltage generating circuit in FIG. 14; and FIG. 18 is a block diagram showing a configuration example of a signal processing circuit utilizing the voltage generating circuit according to the fourth embodiment.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
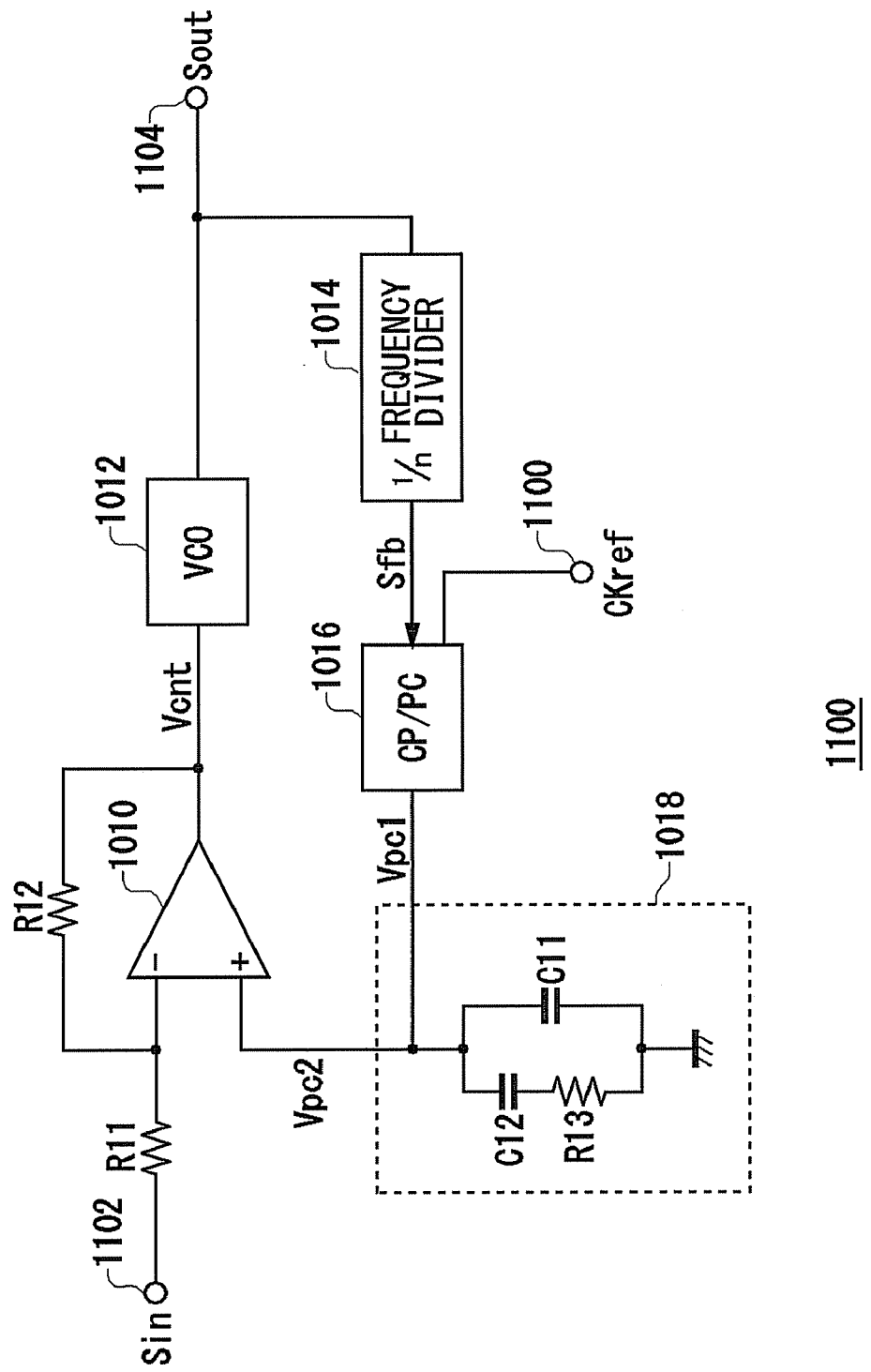

A frequency modulator according to the first embodiment is a direct-modulation frequency modulator that includes a PLL including a VCO, a frequency divider, a phase comparator, and a loop filter and multiplexes a modulating signal with an input signal to the VCO. FIG. 1 is a circuit diagram showing a configuration of a frequency modulator 1100 according to the first embodiment of the invention. The frequency modulator 1100 performs frequency modulation based on an input signal Sin as a modulating signal, which is input to an input terminal 1102, and outputs a modulated signal Sout from an output terminal 1104. A reference clock signal CKref is input to a reference clock terminal 1106. In the embodiment, the input signal Sin is provided with a predetermined direct-current bias, and biased to the midpoint (Vcc/2) between the power supply potential and the ground potential, for example.

The frequency modulator 1100 includes an operational amplifier 1010, a VCO 1012, a frequency divider 1014, a phase comparator 1016, a loop filter 1018, a first resistor R11, and a second resistor R12, and they are integrated on a single semiconductor substrate.

The input signal Sin as the modulating signal is input to an inverting input terminal of the operational amplifier 1010 via the first resistor R11. As the operational amplifier 1010, for example, a rail amplifier having a wide input and output voltage range may be used. The circuit configuration of the operational amplifier 1010 is not specifically limited as long as it has a differential amplifier circuit at the input stage.

The second resistor R12 is provided on a feedback path between the output terminal and the inverting input terminal of the operational amplifier 1010. An output voltage from the operational amplifier 1010 (hereinafter, referred to as a control voltage Vcnt) is input to the VCO 1012. The VCO 1012 generates the modulated signal Sout having a frequency frf according to the control voltage Vcnt. The output signal Sout is output outward from the output terminal 1104 and input to the frequency divider 1014.

The frequency divider 1014 frequency-divides the output signal Sout of the VCO 1012 to 1/n and outputs a feedback signal Sfb. The phase comparator 1016 compares the feedback signal Sfb having a frequency of frf/n output from the frequency divider 1014 with the reference clock signal CKref input to the reference clock terminal 1106, and outputs a voltage according to the phase difference of the two signals (hereinafter, referred to a phase difference voltage Vpc). The phase comparator 1016 may have any configuration, and may be configured with a phase comparator circuit that outputs a charge signal or a discharge signal according to the phase difference between the feedback signal Sfb and the reference clock signal CKref and a charge pump circuit that charges or discharges the capacitor according to the charge signal or discharge signal.

The loop filter 1018 removes a high-frequency component of a phase difference voltage Vpc1 as an output signal from the phase comparator 1016. A phase difference voltage Vpc2 output from the loop filter 1018 is input to a non-inverting input terminal of the operational amplifier 1010. In the embodiment, the loop filter 1018 is configured with a passive filter including a first capacitor C11, a second capacitor C12, and a third resistor R13. The first capacitor C11 is provided between an output terminal of the phase comparator 1016 and the ground. The second capacitor C12 and the third resistor R13 are connected in series and provided on a path in parallel with the first capacitor C11. However, the configuration of the loop filter 1018 is not limited to that of the embodiment, but any configuration may be adopted as long as a desired cutoff frequency is obtained, and the filter may be configured with an active filter in some cases.

An operation of the frequency modulator 1100 configured as above will be described.

The following relational expression (1) holds among the input signal Sin input to the input terminal 1102, the phase difference voltage Vpc2 output from the loop filter 1018, and the control voltage Vcnt.

$$Vcnt=(1+R12/R11) \times Vpc2-R12/R11 \times Sin \qquad \text{expression (1)}$$

That is, the operational amplifier 1010, the first resistor R11, and the second resistor R12 function as an inverting amplifier for the input signal Sin, as the modulating signal, input to the input terminal 1102. The gain G1 of the inverting amplifier is determined with the resistances of the first resistor R11 and the second resistor R12, and given by G1=R12/R11. In the embodiment, R11:R12 is set to about 10:1. The gain G1 in this case is about −20 dB.

Further, the operational amplifier 1010, the first resistor R11, and the second resistor R12 function as a non-inverting amplifier for the phase difference voltage Vpc2 output from the loop filter 1018. The gain G2 of the non-inverting amplifier is given by (1+R12/R11) using the resistances of the first resistor R11 and the second resistor R12.

The input signal Sin and the phase difference voltage Vpc2 as the output signal from the loop filter 1018 are multiplexed by the operational amplifier 1010, the first resistor R11, and the second resistor R12 to generate the control voltage Vcnt. Since the VCO 1012 oscillates at a frequency depending on the control voltage Vcnt, the frequency modulator 1100 may generate the modulated signal Sout frequency-modulated according to the input signal Sin.

According to the embodiment, the input impedance of the operational amplifier 1010 is high, and thereby, the influence of the impedance of the loop filter 1018 on the circuit at the input terminal 1102 side can be reduced. As a result, the loop filter 1018 is not seen from the input signal Sin, and the high-frequency range of the input signal Sin is prevented from attenuating due to the loop filter 1018 and the signal distortion can be suppressed.

Further, when coupled using a resistance and a capacitor as in the conventional manner, the signal output from the loop filter 1018 is sometimes leaked to the side of the input signal Sin. However, in the frequency modulator 1100 according to the embodiment, the problem can be solved because the input impedance of the operational amplifier 1010 is high.

Furthermore, when a coupling capacitor is used in the conventional technology, it is necessary to make its capacitance very large since the capacitor configures a high-pass filter with other circuit elements. Therefore, it is necessary to provide the capacitor as an external component because the capacitor can not be integrated. On the other hand, in the frequency modulator 1100 according to the embodiment, the input signal Sin can be multiplexed with the input of the VCO 1012 of the PLL without using a coupling capacitor, and therefore, external components can be reduced. Further, although two terminals have been required if the coupling capacitor is externally provided, these terminals can be eliminated and the chip area can be reduced.

At least one of the first resistor R11 and the second resistor R12 may be configured as a variable resistor. In this case, the loop gain and the amplitude of the input signal can be adjusted according to the characteristic of the VCO 1012.

When a rail amplifier is used as the operational amplifier 1010, the voltage range of the control voltage Vcnt as the input signal to the VCO 1012 can be set wider, and therefore, the frequency band of the high-frequency signal output from the frequency modulator 1100 can be taken wider.

Figure 2:
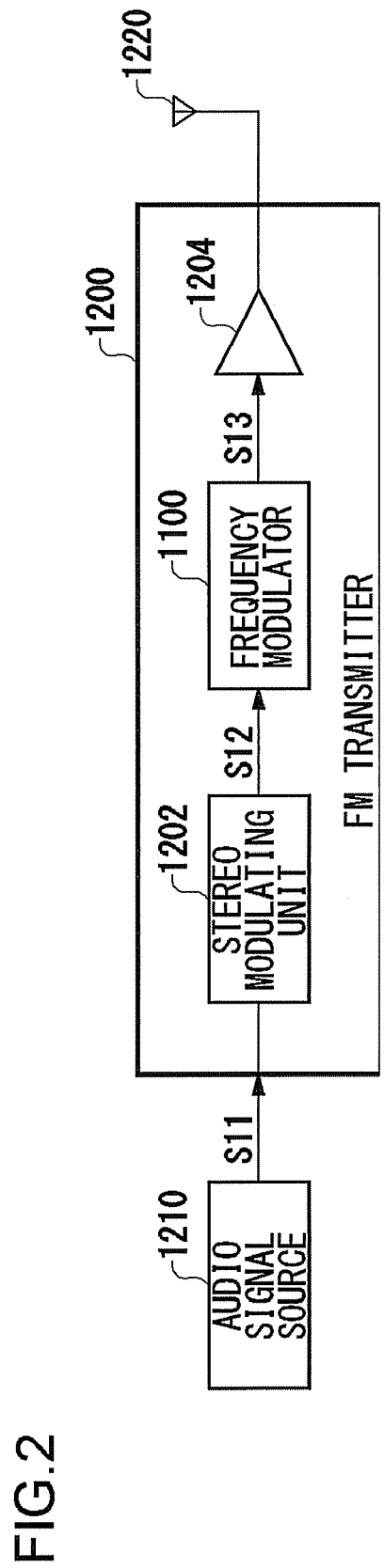

Next, an application example of the frequency modulator 1100 according to the embodiment will be described. FIG. 2 is a block diagram showing a configuration of an FM transmitter 1200 using the frequency modulator 1100 in FIG. 1. The FM transmitter 1200 converts an audio signal into a stereo composite signal, performs frequency modulation, amplifies, and then output the resultant signal from an antenna. Such an FM transmitter 1200 may be used when a signal is transmitted without a cable in an in-car audio system, or built-in in a portable terminal for use in transmission an audio signal to stationary audio equipment. The FM transmitter 1200 may include a stereo modulating unit 1202 and a power amplifier 1204 in addition to the frequency modulator 1100 in FIG. 1, and they may be integrated in one LSI or may be divided to separate ICs.

An audio signal source 1210 is a CD player, an MD player, a memory audio system, a disk audio system, or the like and generates an audio signal S11 and outputs it to the FM transmitter 1200. The stereo modulating unit 1202 converts the audio signal S11 into a stereo composite signal S12. The stereo composite signal S12 is input to the frequency modulator 1100 in FIG. 1. The frequency modulator 1100 performs frequency modulation based on the stereo composite signal S12 and generates a modulated signal S13 (Sout). The modulated signal S13 output from the frequency modulator 1100 is amplified by the power amplifier 1204 and transmitted from an antenna 1220. In FIG. 2, only the main blocks of the FM transmitter 1200 are simplistically shown and other circuit blocks such as filters are not shown.

Since the FM transmitter 1200 in FIG. 2 is configured using the frequency modulator 1100 in FIG. 1, the number of components is reduced and then downsizing becomes easier. Consequently, packaging in a cellular phone unit or the like becomes easier.

It would be understood by the person skilled in the art that the embodiment is just for illustration and various modifications of combinations of the respective component elements and the respective processing processes, and the modifications are within the scope of the invention.

Although the first embodiment has the configuration using the operational amplifier 1010, the first resistor R11, and the second resistor R12, a filter function may be provided by adding a capacitor thereto. Further, an active filter may be used as the loop filter 1018.

Second Embodiment

Figure 3:
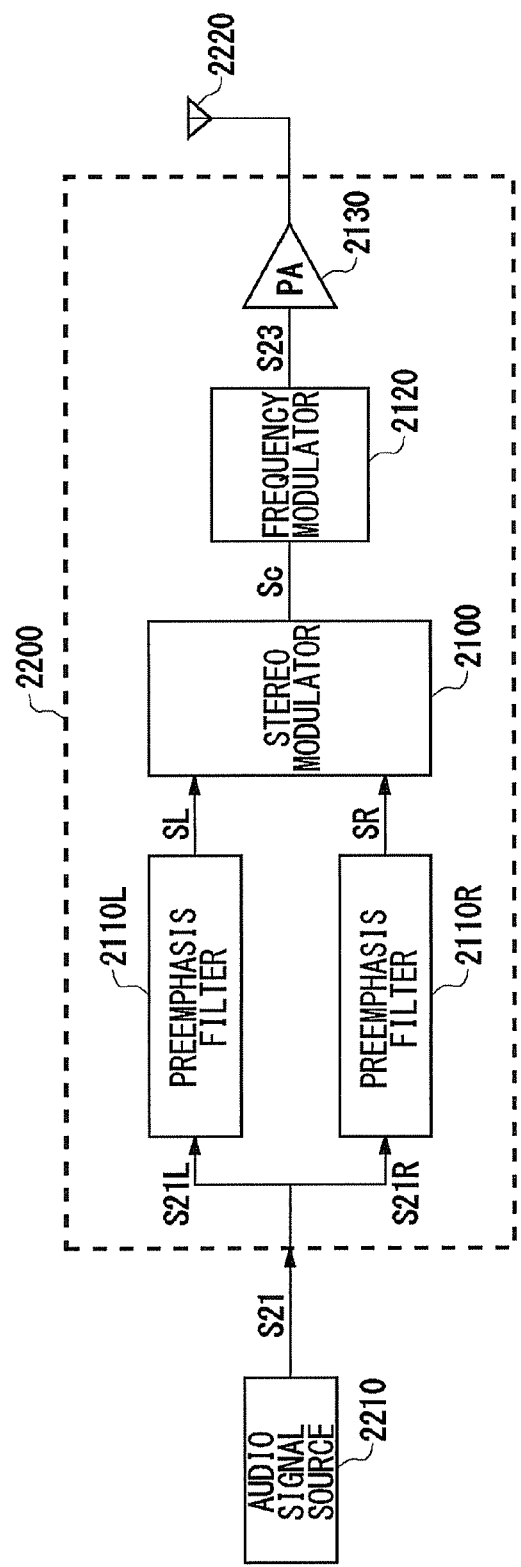

FIG. 3 is a block diagram showing a configuration of an FM transmitter 2200 according to the second embodiment of the invention. The FM transmitter 2200 converts an audio signal into a stereo composite signal, performs frequency modulation, amplifies, and then output the resultant signal from an antenna. Such an FM transmitter 2200 may be used when a signal is transmitted without a cable in an in-car audio system, or built-in in a portable terminal for use in transmission an audio signal to stationary audio equipment.

The FM transmitter 2200 includes preemphasis filters 2110L, 2110R, a stereo modulator 2100, a frequency modulator 2120, and a power amplifier 2130. In the FM transmitter 2200, the respective blocks may be integrated in one LSI or may be divided to separate ICs. In FIG. 3, only the main blocks of the FM transmitter 2200 are simplistically shown and other circuit blocks such as filters are not shown.

An audio signal source 2210 is a CD player, an MD player, a memory audio system, a disk audio system, or the like and generates an audio signal S21 and outputs it to the FM transmitter 2200. The preemphasis filters 2110L, 2110R perform frequency correction on audio signals S21L, S21R corresponding to the L-channel and the R-channel of the stereo signal, respectively, and output them to the stereo modulator 2100. The stereo modulator 2100 converts the audio signals SL, SR output from the preemphasis filters 2110L, 2110R into a stereo composite signal Sc. The stereo composite signal Sc is input to the frequency modulator 2120.

The frequency modulator 2120 uses the stereo composite signal Sc as a modulating signal and generates a high-frequency-modulated signal S23 frequency-modulated based on the modulating signal. The frequency modulator 2120 is a direct-modulation frequency modulator that includes a PLL (Phase Locked Loop) configured using a VCO, a frequency divider, a phase comparator, and a loop filter and multiplexes an audio signal with an input signal to the VCO. The modulated signal S23 generated by the frequency modulator 2120 is amplified by the power amplifier 2130 and transmitted from an antenna 2220.

Figure 4:
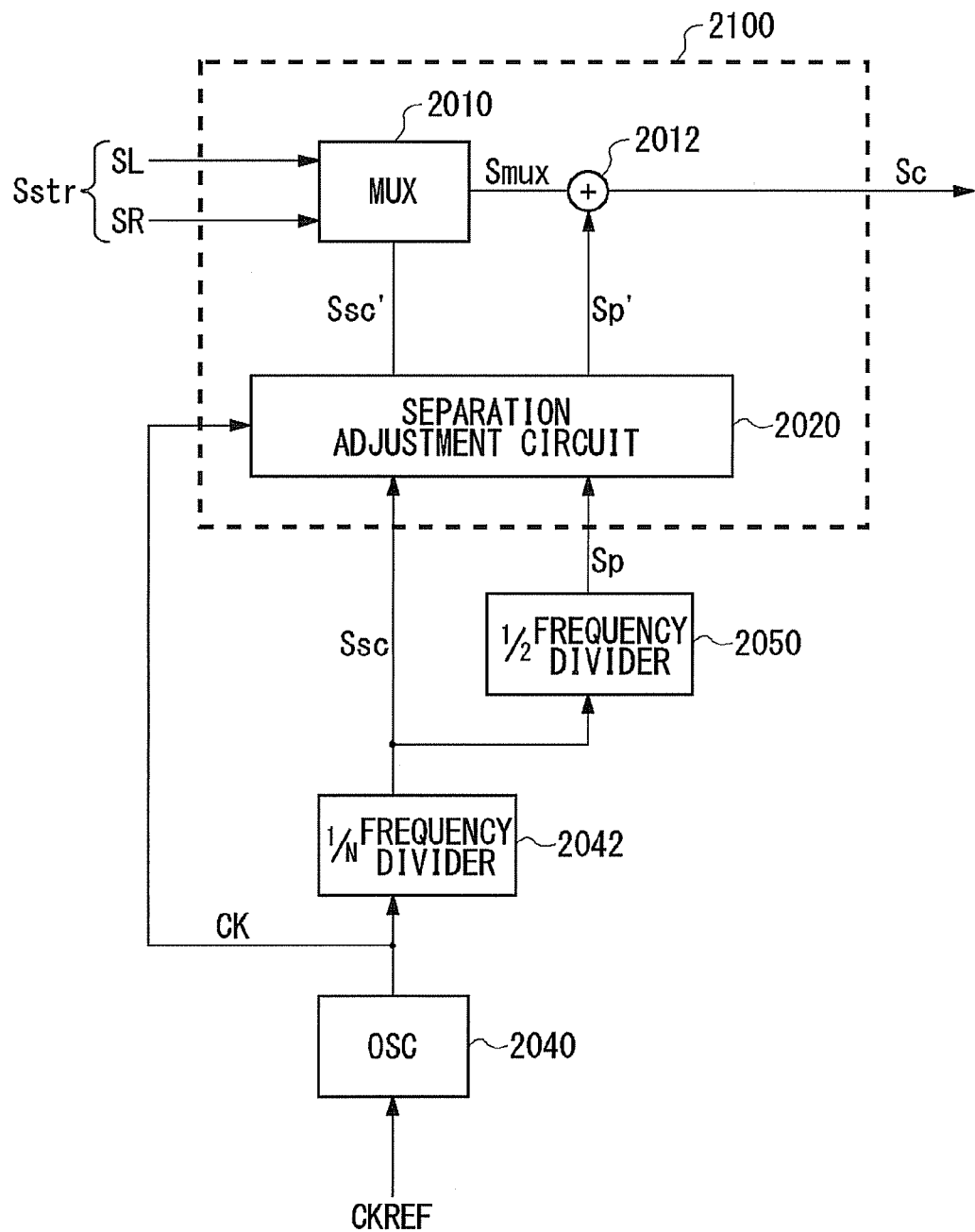

FIG. 4 is a circuit diagram showing a configuration of the stereo modulator 2100 according to the second embodiment of the invention and a peripheral circuit thereof. A stereo signal Sstr containing a left-channel signal SL and a right-channel signal SR, a subcarrier wave Ssc having a frequency of 38 kHz and a pilot signal Sp having a frequency of 19 kHz are input to the stereo modulator 2100.

An oscillator 2040 is a PLL or the like, and frequency-multiplies the input reference clock signal CKREF to generate an internal clock signal CK. The internal clock signal CK generated by the oscillator 2040 is output to a separation adjustment circuit 2020. Note that, when the frequency of the reference clock signal CKREF is sufficiently high, such as more than several megahertz, the signal can be used as the internal clock signal CK as is, and therefore, the oscillator 2040 may be eliminated.

The internal clock signal CK generated by the oscillator 2040 is input to a frequency divider 2042. The frequency divider 2042 frequency-divides the internal clock signal CK to 1/N to generates the subcarrier wave Ssc having a frequency of 38 kHz. For example, the frequency divider 2042 may be a programmable frequency divider having a variable frequency division ratio N.

The subcarrier wave Ssc generated by the frequency divider 2042 is input to the stereo modulator 2100 as well as input to a frequency divider 2050. The frequency divider 2050 frequency-divides the subcarrier wave Ssc and generates the pilot signal Sp having a frequency of 19 kHz. In this case, the frequency of the clock signal CK is from about several mega hertz to 30 mega hertz, an integral multiplication of the frequencies of the subcarrier wave Ssc and the pilot signal Sp.

The stereo modulator 2100 generates a stereo composite signal Sc based on the stereo signal Sstr, the subcarrier wave Ssc, and the pilot signal Sp. As below, the configuration of the stereo modulator 2100 will be described.

The stereo modulator 2100 includes a multiplexer 2010, the separation adjustment circuit 2020, and a pilot signal multiplexing unit 2012.

The subcarrier wave Ssc and the pilot signal Sp are input to the separation adjustment circuit 2020. The separation adjustment circuit 2020 includes a delay circuit that delays one of the subcarrier wave Ssc and the pilot signal Sp. Though the details will be described later, the delay circuit is to be delayed the input signal by the time length, in which a predetermined clock signal is counted up to n cycle (s) (n is a counting number).

The multiplexer 2010 composites a subcarrier wave Ssc' output from the separation adjustment circuit 2020 and the stereo signal Sstr. The multiplexer 2010 first generates a sum signal (a main channel signal) and a difference signal (a subchannel signal) of the left-channel signal and the right-channel signal. Then, the multiplexer amplitude-modulates the subcarrier wave Ssc' output from the separation adjustment circuit 2020 using the subchannel signal. Furthermore, the multiplexer multiplexes the subcarrier wave amplitude-modulated with the subchannel signal and the main channel signal, and outputs a composite signal Smux.

The pilot signal multiplexing unit 2012 multiplexes a pilot signal Sp' output from the separation adjustment circuit 2020 and the multiplexed signal Smux output from the multiplexer 2010. An output signal from the pilot signal multiplexing unit 2012 is output as the stereo composite signal Sc to the frequency modulator 2120 placed downstream.

Figure 5:
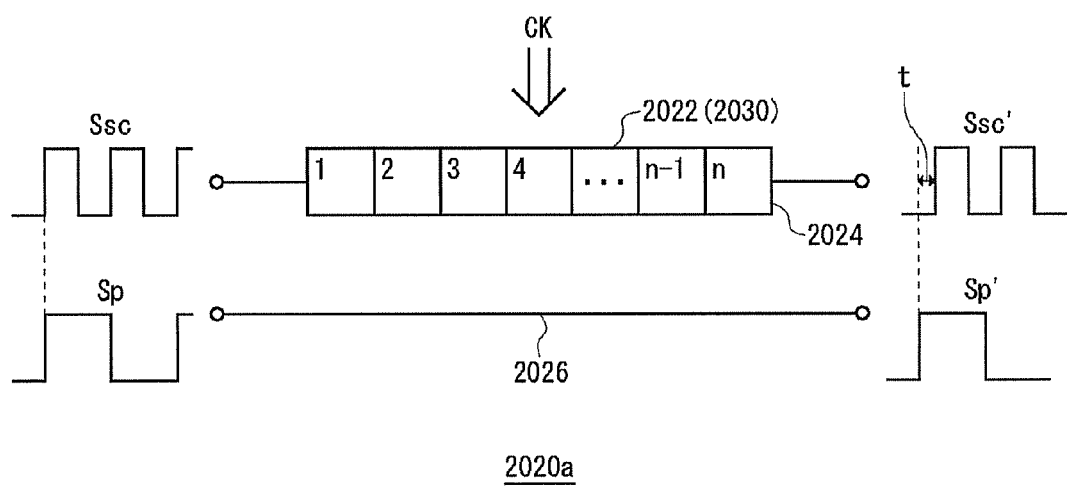

Next, a configuration of the separation adjustment circuit 2020 will be described. FIG. 5 is a circuit diagram showing a first configuration example of the separation adjustment circuit 2020. The separation adjustment circuit 2020a in FIG. 5 includes a first shift register 2022 and a signal line 2026. The subcarrier wave Ssc is input to the first shift register 2022 and the register operates as a delay circuit 2030 that provides a predetermined delay to the subcarrier wave Ssc. The first shift register 2022 shifts the input subcarrier wave Ssc by one bit for each clock of the clock signal CK. The clock signal CK may be the reference clock signal of the oscillator 2040 as is or a signal formed by frequency-multiplying or frequency-dividing the reference clock signal. That is, it is desirable that the clock signal CK to be input to the separation adjustment circuit 2020 is a signal that shares the common origin with the reference clock signal used for generating the subcarrier wave Ssc and the pilot signal Sp.

The first shift register 2022 outputs a signal Ssc' formed by n-bit shifting the subcarrier wave Ssc from an output terminal 2024 thereof. Given that the cycle time of the clock signal CK is Tck, the output signal Ssc' of the first shift register 2022 is a signal delayed by $\tau = Tck \times n$ relative to the input signal Ssc thereof. Thus, the first shift register 2022 functions as a delay circuit that delays the input signal by the time length, in which a predetermined clock signal CK is counted up to n cycle(s).

In the separation adjustment circuit 2020a in FIG. 5, while the subcarrier wave Ssc is input to the first shift register 2022 and delayed, the pilot signal Sp is output as is via the signal line 2026. Consequently, the phase of the subcarrier wave Ssc can be delayed relative to the pilot signal Sp.

With the stereo modulator 2100 according to the embodiment, the subcarrier wave Ssc is delayed using the clock signal and the difference between the respective amounts of delay for the subcarrier wave Ssc and the pilot signal Sp (i.e., the phase difference) is cancelled in the system equipped with the stereo modulator 2100, and therefore, a signal having an advantage in separation characteristic can be output.

Further, according to the separation adjustment circuit 2020a in FIG. 5, the amount of delay can be controlled by changing the frequency of the clock signal CK.

If the phase delay of the pilot signal Sp is smaller in the system equipped with the stereo modulator 2100, the delay circuit 2030 may be provided on the path of the pilot signal Sp and the subcarrier wave Ssc may be input to the signal line 2026.

Figure 6:
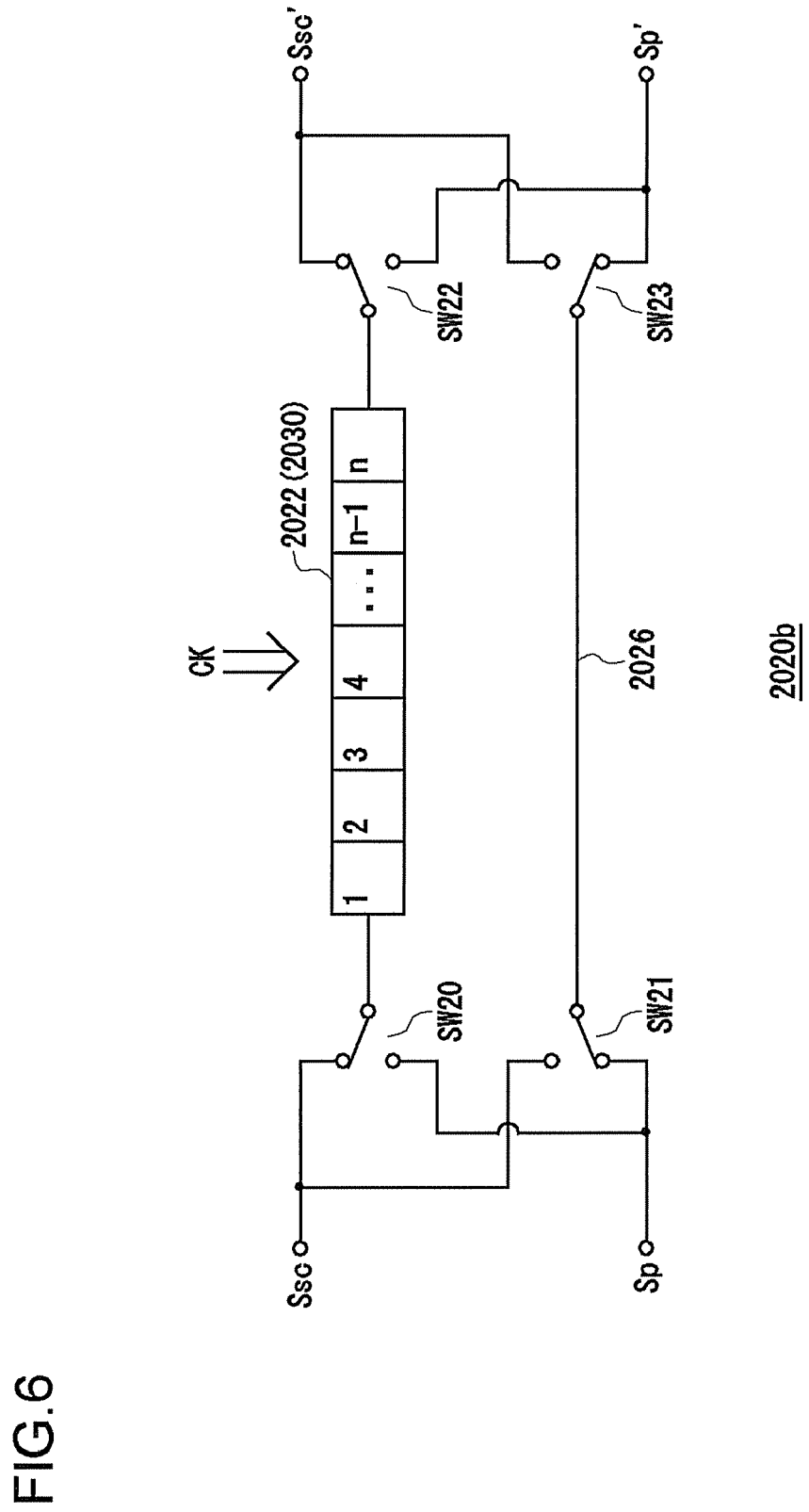

FIG. 6 is a circuit diagram showing a second configuration example of the separation adjustment circuit. The separation adjustment circuit 2020b in FIG. 6 includes switches SW20 to SW23 in addition to the separation adjustment circuit 2020a in FIG. 5. The switches SW20 to SW23 are for switching either one of the subcarrier wave Ssc and the pilot signal Sp is input to the delay circuit 2030. Depending on the system configurations, both cases where the phase delay of the subcarrier wave Ssc is larger and where the phase delay of the pilot signal Sp is larger are conceivable. With the separation adjustment circuit 2020b in FIG. 6, both cases can be accommodated because which one of the subcarrier wave Ssc or the pilot signal Sp to be delayed can be selected.

Figure 7:
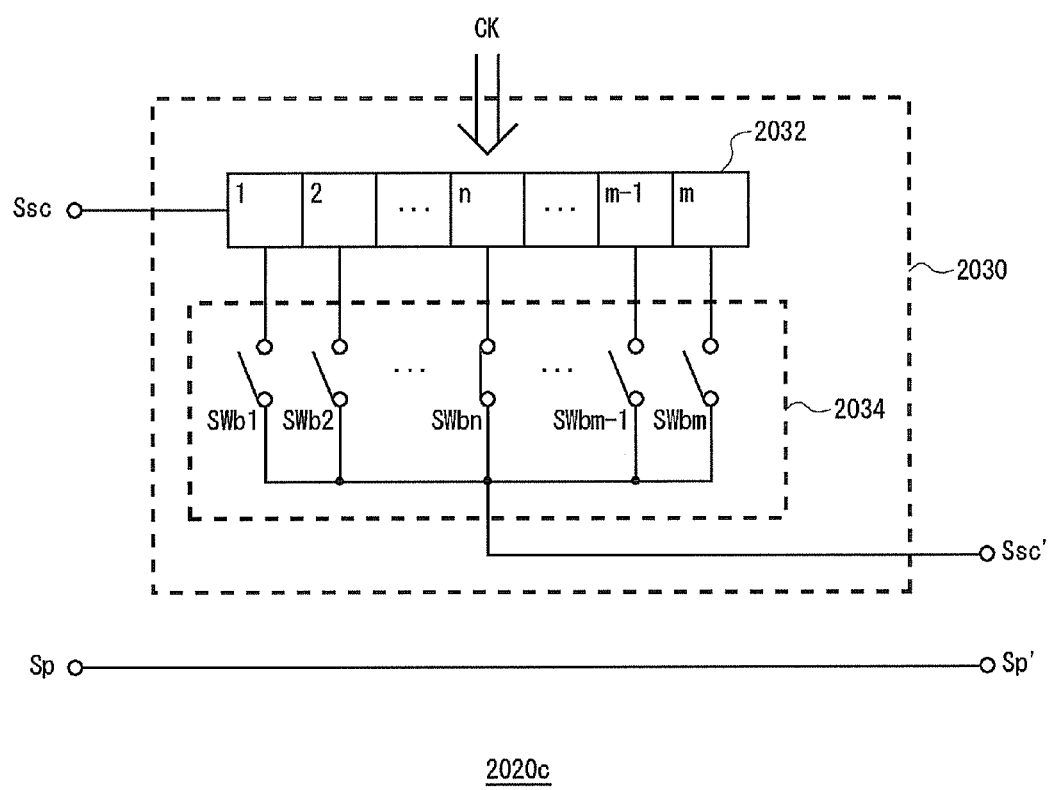

FIG. 7 is a circuit diagram showing a third configuration example of the separation adjustment circuit 2020. In the separation adjustment circuit 2020c in FIG. 7, the delay circuit 2030 includes a first shift register 2032 and a selecting unit 2034. The first shift register 2032 is a shift register capable of shifting m bits at the maximum. For example, m is 32 bits or 64 bits, and the register is designed so that m≧n may hold. How many bits the shift register can shift may be determined according to the maximum value of the necessary amount of delay and the frequency of the clock signal CK.

The selecting unit 2034 includes switches SWb1 to SWbm. The selecting unit 2034 selects and outputs an n-bit shifted signal from the first shift register 2032. For example, when the switch SWb1 of the selecting unit 2034 is turned on, a signal formed by delaying the subcarrier wave Ssc by the time Tck corresponding to one clock cycle is output from the delay circuit 2030. When the 64th switch SWb64 is turned on, a signal delayed by Tck×64 is output.

The difference in amount of delay between the subcarrier wave Ssc and the pilot signal Sp changes depending on the configuration of the peripheral circuit. The separation adjustment circuit 2020c in FIG. 7 is configured to provide the amount of shift externally controllable for accommodating various amounts of delay. That is, the number of cycles n to be counted by the delay circuit 2030 of the separation adjustment circuit is externally controllable.

According to the separation adjustment circuit 2020c in FIG. 7, the delay time can be adjusted by turning on either one of the switches of the selecting unit 2034, and therefore the separation characteristic can be improved. Further, when the frequency of the clock signal CK changes, delay time can be adjusted by controlling the selecting unit 2034 according thereto.

Figure 8:
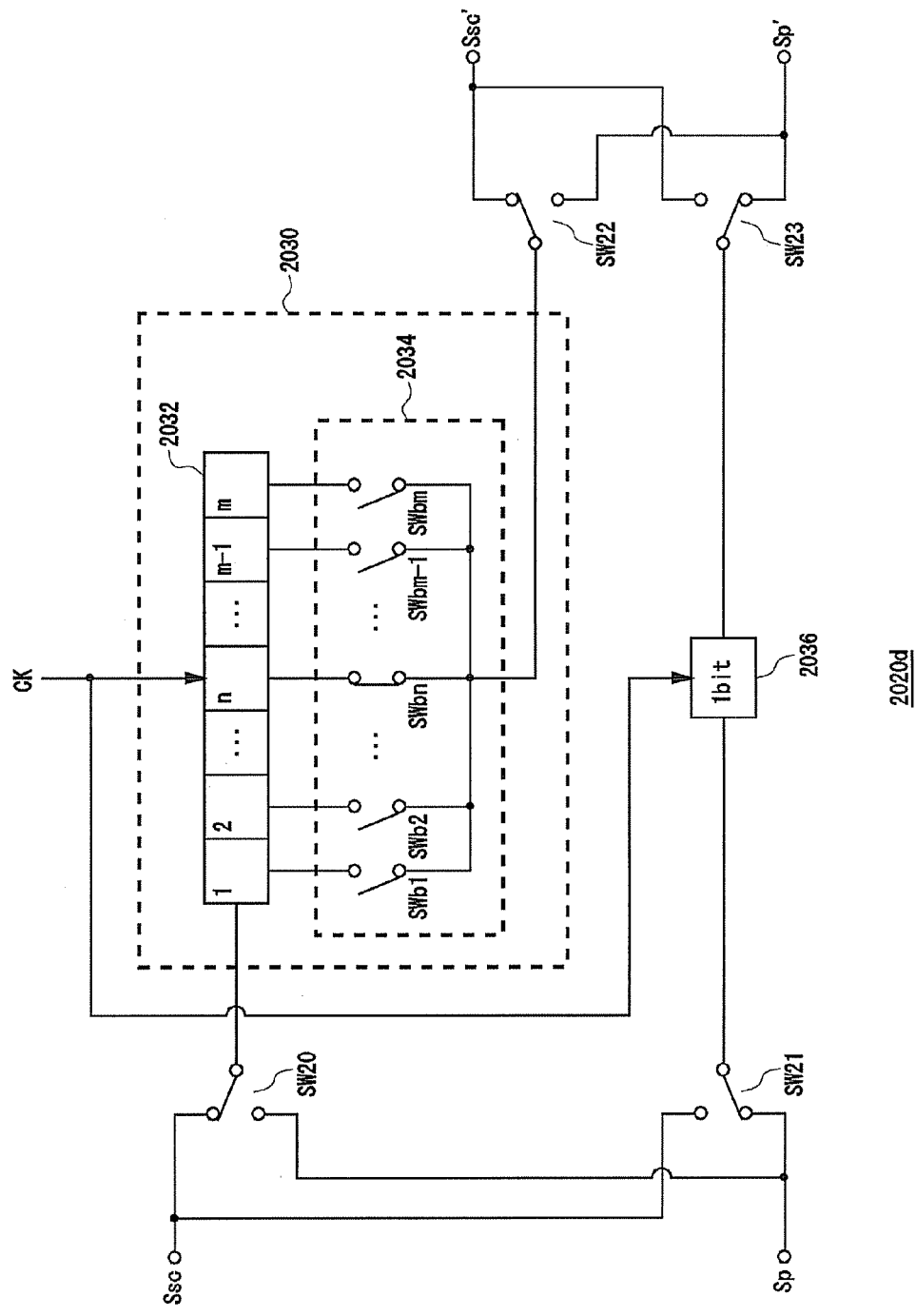

FIG. 8 is a circuit diagram showing a fourth configuration example of the separation adjustment circuit. The separation adjustment circuit 2020d in FIG. 8 is characterized by adding a second shift register 2036 to the separation adjustment circuit 2020c in FIG. 7. The second shift register 2036 delays the input signal by one clock cycle of the clock signal CK. One of the subcarrier wave Ssc and the pilot signal Sp is input to the delay circuit 2030, and the other is input to the second shift register 2036. Consequently, the delay of Tck×n is provided to the signal input to the delay circuit 2030, while the delay of Tck is provided to the signal input to the second shift register 2036.

The separation adjustment circuit 2020d in FIG. 8 further includes switches SW20 to SW23. The switches SW20 to SW23 switch either one of the subcarrier wave Ssc and the pilot signal Sp is input to the first shift register 2032 and the second shift register 2036, respectively.

According to the separation adjustment circuit 2020d in FIG. 8, both of the input subcarrier wave Ssc and pilot signal Sp are output via the shift registers that operate with the same clock signal. Consequently, the amounts of delay of the subcarrier wave Ssc' and the pilot signal Sp' to be output can be accurately set to a constant number multiple of the cycle of the clock signal.

Further, since the switches SW20 to SW23 are provided, which one of the subcarrier wave Ssc or the pilot signal Sp is delayed can be selected.

With the stereo modulator 2100 according to the embodiment, the separation adjustment circuit 2020 shown in FIGS. 5 to 8 is provided to provide the phase delay to the subcarrier wave Ssc or the pilot signal Sp, and therefore, the phase shift generated in the VCO and the loop filter of the frequency modulator 2120 can be compensated and therefore the separation characteristic can be improved.

Since the separation adjustment circuit 2020 performs phase compensation using a digital circuit, it can perform the phase compensation without using a capacitor that has a very large capacitance, and therefore the circuit can be downsized. Further, the amount of delay can be flexibly set and also the amount of delay can be changed even after the circuit is packaged in a set by changing the frequency of the clock signal in the separation adjustment circuit 2020 shown in FIGS. 5 to 8 and by additionally controlling the selecting unit 2034 in the separation adjustment circuit 2020 shown in FIGS. 7 and 8.

It would be understood by the person skilled in the art that the embodiment is just for illustration and various modifications of combinations of the respective component elements and the respective processing processes, and the modifications are within the scope of the invention.

In the second embodiment, the shift register is operated utilizing the reference clock signal input to the oscillator 2040. As a result, the embodiment has an advantage that the system can be simplified. However, as the clock signal for operating the shift register, a signal supplied from another system may be utilized. In this case, the embodiment has an advantage that the delay time can be flexibly set by the frequency of the clock signal.

Third Embodiment

Figure 9:
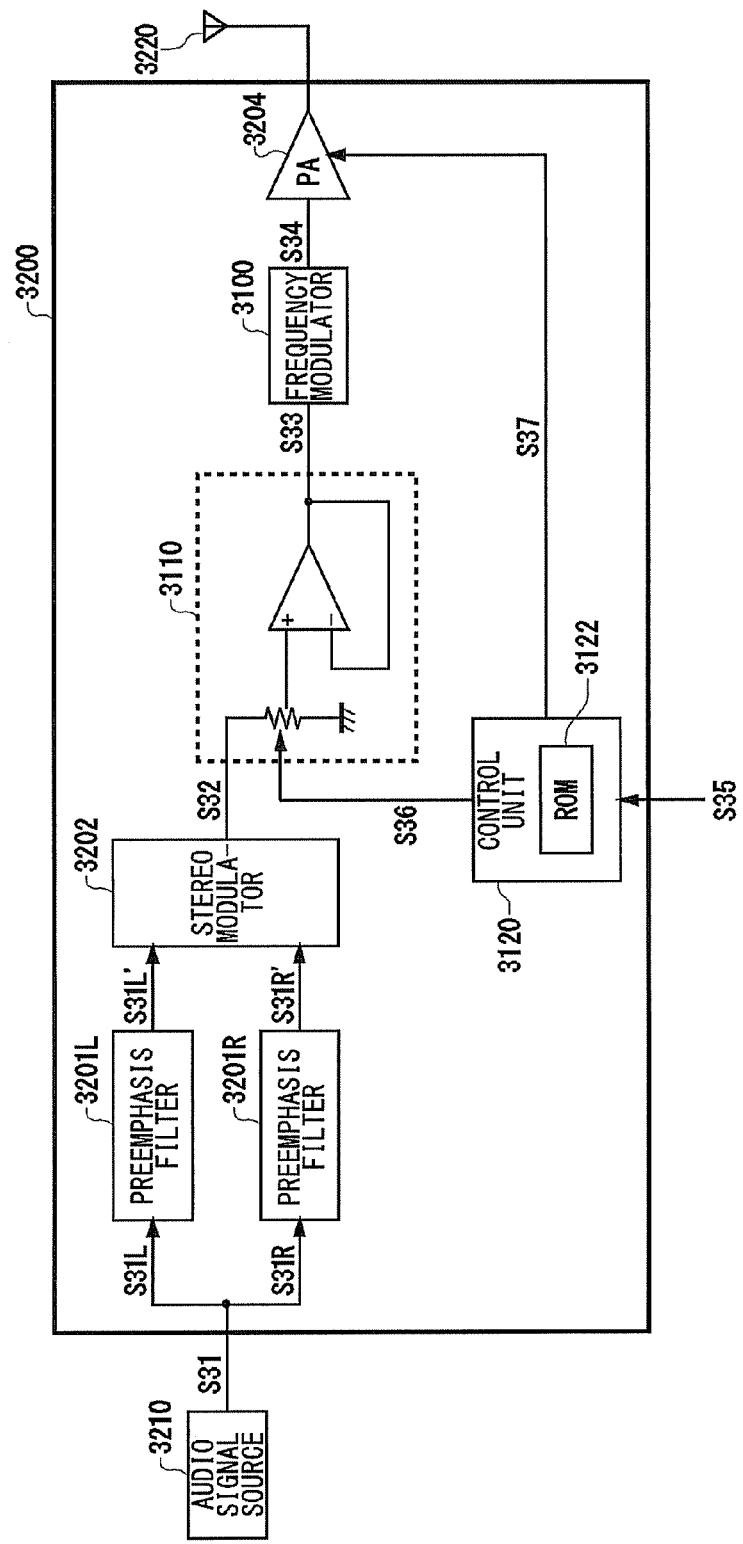

FIG. 9 is a block diagram showing a configuration of an FM transmitter 3200 according to the third embodiment of the invention. The FM transmitter 3200 converts an audio signal into a stereo composite signal, performs frequency modulation, amplifies, and then output the resultant signal from an antenna. Such an FM transmitter 3200 may be used when a signal is transmitted without a cable in an in-car audio system, or built-in in a portable terminal for use in transmission an audio signal to stationary audio equipment.

The FM transmitter 3200 includes preemphasis filters 3201L, 3201R, a stereo modulator 3202, a variable gain amplifier 3110, a frequency modulator 3100, a power amplifier 3204, and a control unit 3120. In the FM transmitter 3200, the respective blocks may be integrated in one LSI or may be divided to separate ICs. In FIG. 9, only the main blocks of the FM transmitter 3200 are simplistically shown and other circuit blocks such as filters are not shown.

An audio signal source 3210 is a CD player, an MD player, a memory audio system, a disk audio system, or the like and generates an audio signal S31 and outputs it to the FM transmitter 3200. The preemphasis filters 3201L, 3201R perform frequency correction on audio signals S31L, S31R corresponding to the L-channel and the R-channel of the stereo, respectively, and output them to the stereo modulator 3202. The stereo modulator 3202 converts audio signals S31L', S31R' output from the preemphasis filters 3201L, 3201L into a stereo composite signal S32. The stereo composite signal S32 is input to the variable gain amplifier 3110.

The variable gain amplifier 3110 amplifies the input stereo composite signal S32 so as to adjust the amplitude thereof. The gain of the variable gain amplifier 3110 is externally controllable. A stereo composite signal S33 output from the variable gain amplifier 3110 is input to the frequency modulator 3100.

The frequency modulator 3100 uses the stereo composite signal S33, which is an output from the variable gain amplifier 3110, as a modulating signal and generates a modulated signal S34 frequency-modulated based on the modulating signal. The frequency of the modulated signal S34 is controlled by a DSP (Digital Signal Processor) (not shown) that controls the equipment in which the FM transmitter 3200 is mounted or the like.

The modulated signal S34 generated by the frequency modulator 3100 is amplified by the power amplifier 3204 and transmitted from an antenna 3220. The power amplifier 3204 has a gain similarly controllable to that of the variable gain amplifier 3110.

A control signal S35 that indicates the frequency of the modulated signal S34 output form the frequency modulator 3100 is input from the DSP (not shown) or the like to the control unit 3120. The control unit 3120 sets the gains of the variable gain amplifier 3110 and the power amplifier 3204 according to the control signal S35. The control unit 3120 outputs gain control signals S36, S37 to the variable gain amplifier 3110 and the power amplifier 3204, respectively. The gains of the variable gain amplifier 3110 and the power amplifier 3204 are set according to the gain control signals S36, S37. The method of setting the gains will be described later.

Figure 10:
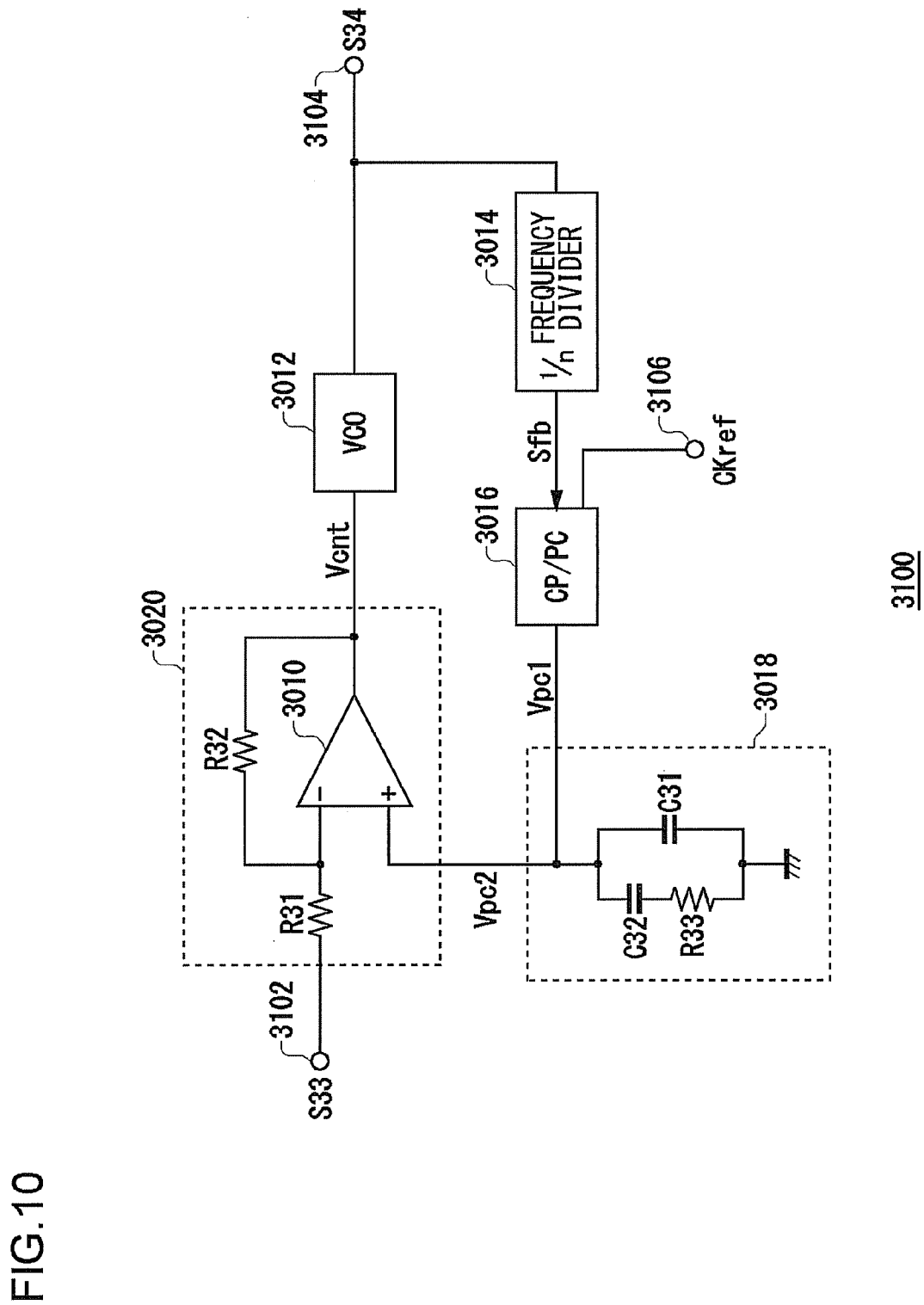

FIG. 10 is a circuit diagram showing a preferred configuration example of the frequency modulator 3100. The frequency modulator 3100 is a direct-modulation frequency modulator that includes a PLL configured using a VCO, a frequency divider, a phase comparator, and a loop filter and multiplexes an audio signal with an input signal to the VCO. The frequency modulator 3100 performs frequency modulation based on the input signal S33 as a modulating signal input to an input terminal 3102, and outputs the modulated signal S34 from an output terminal 3104. A reference clock signal CKref is input to a reference clock terminal 3106. In the embodiment, the input signal S33 is provided with a predetermined direct-current bias, and biased to the midpoint (Vcc/2) between the power supply potential and the ground potential, for example.

The frequency modulator 3100 includes a VCO 3012, a frequency divider 3014, a phase comparator 3016, a loop filter 3018, and a multiplexing circuit 3020, and they are integrated on a single semiconductor substrate.

The multiplexing circuit 3020 includes an operational amplifier 3010, a first resistor R31, and a second resistor R32. The input signal S33 is input to an inverting input terminal of the operational amplifier 3010 via the first resistor R31. As the frequency modulator 3100, for example, a rail-to-rail amplifier having a wide input and output voltage range may be used. The circuit configuration of the operational amplifier 3010 is not specifically limited as long as it has a differential amplifier circuit at the input stage.

The second resistor R32 is provided on a feedback path between the output terminal and the inverting input terminal of the operational amplifier 3010. An output voltage from the operational amplifier 3010 (hereinafter, referred to as a control voltage Vcnt) is input to the VCO 3012. The VCO 3012 generates the output signal S34 having a frequency depending on the control voltage Vcnt. The output signal S34 is output outward from the output terminal 3104 and input to the frequency divider 3014. It is desirable that the multiplexing circuit 3020 has the configuration shown in FIG. 10, however, the circuit may have a conventional configuration not using the operational amplifier but using a resistance and a coupling capacitor.

The frequency divider 3014 frequency-divides the output signal (i.e., the modulated signal S34) of the VCO 3012 to 1/n and outputs a feedback signal Sfb. The phase comparator 3016 compares the feedback signal Sfb having a frequency of frf/n output from the frequency divider 3014 with the reference clock signal CKref input to the reference clock terminal 3106, and outputs a voltage according to the phase difference of the two signals (hereinafter, referred to a phase difference voltage Vpc). The phase comparator 3016 may have any configuration, and may be configured with a phase comparator circuit that outputs a charge signal or discharge signal according to the phase difference between the feedback signal Sfb and the reference clock signal CKref and a charge pump circuit that charges or discharges the capacitor according to the charge signal or discharge signal.

The loop filter 3018 removes the high-frequency component of a phase difference voltage Vpc1 as an output signal from the phase comparator 3016. A phase difference voltage Vpc2 output from the loop filter 3018 is input to a non-inverting input terminal of the operational amplifier 3010. In the embodiment, the loop filter 3018 is configured with a passive filter including a first capacitor C31, a second capacitor C32, and a third resistor R33. The first capacitor C31 is provided between an output terminal of the phase comparator 3016 and the ground. The second capacitor C32 and the third resistor R33 are connected in series and provided on a path in parallel with the first capacitor C31. However, the configuration of the loop filter 3018 is not limited to that of the embodiment, but any configuration may be adopted as long as a desired cutoff frequency is obtained, and the filter may be configured with an active filter in some cases.

An operation of the frequency modulator 3100 configured as above will be described.

The following relational expression (1) holds among the input signal S33 input to the input terminal 3102, the phase difference voltage Vpc2 output from the loop filter 3018, and the control voltage Vcnt.

$$Vcnt=(1+R32/R31)\times Vpc2-R32/R31\times S33 \qquad \text{expression (1)}$$

That is, the operational amplifier 3010, the first resistor R31, and the second resistor R32 function as an inverting amplifier for the input signal S33 input to the input terminal 3102. The gain G1 of the inverting amplifier is determined with the resistances of the first resistor R31 and the second resistor R32, and given by G1=R32/R31. In the embodiment, R31:R32 is set to about 10:1. The gain Ginv in this case is about −20 dB.

Further, the operational amplifier 3010, the first resistor R31, and the second resistor R32 function as a non-inverting amplifier for the phase difference voltage Vpc2 output from the loop filter 3018. The gain G2 of the non-inverting amplifier is given by (1+R32/R31) using the resistances of the first resistor R31 and the second resistor R32.

The input signal S33 and the phase difference voltage Vpc2 as the output signal from the loop filter 3018 are multiplexed by the operational amplifier 3010, the first resistor R31, and the second resistor R32 to generate the control voltage Vcnt.

Since the VCO 3012 oscillates at a frequency depending on the control voltage Vcnt, the frequency modulator 3100 may generate the output signal S34 frequency-modulated according to the input signal S33.

According to the embodiment, the input impedance of the operational amplifier 3010 is high, and thereby, the influence of the impedance of the loop filter 3018 on the circuit at the input terminal 3102 side can be reduced. As a result, the loop filter 3018 is not seen from the input signal S33, and the high-frequency range of the input signal S33 is prevented from attenuating due to the loop filter 3018 and the signal distortion can be suppressed.

Further, when coupled using a resistance and a capacitor as in the conventional manner, the signal output from the loop filter 3018 is sometimes leaked to the side of the input signal S33. However, in the frequency modulator 3100 according to the embodiment, the problem can be solved because the input impedance of the operational amplifier 3010 is high.

Furthermore, when a coupling capacitor is used in the conventional technology, it is necessary to make its capacitance very large since the capacitor configures a high-pass filter with other circuit elements. Therefore, it is necessary to provide the capacitor as an external component because the capacitor can not be integrated. On the other hand, in the frequency modulator 3100 according to the embodiment, the input signal S33 can be multiplexed with the input of the VCO 3012 of the PLL without using a coupling capacitor, and therefore, external components can be reduced. Further, although two terminals have been required if the coupling capacitor is externally provided, these terminals can be eliminated and the chip area can be reduced.

At least one of the first resistor R31 and the second resistor R32 may be configured as a variable resistor. In this case, the loop gain and the amplitude of the input signal can be adjusted according to the characteristic of the VCO 3012.

When a rail-to-rail amplifier is used as the operational amplifier 3010, the voltage range of the control voltage Vcnt as the input signal to the VCO 3012 can be set wider, and therefore, the frequency band of the high-frequency signal output from the frequency modulator 3100 can be taken wider.

Figure 11:
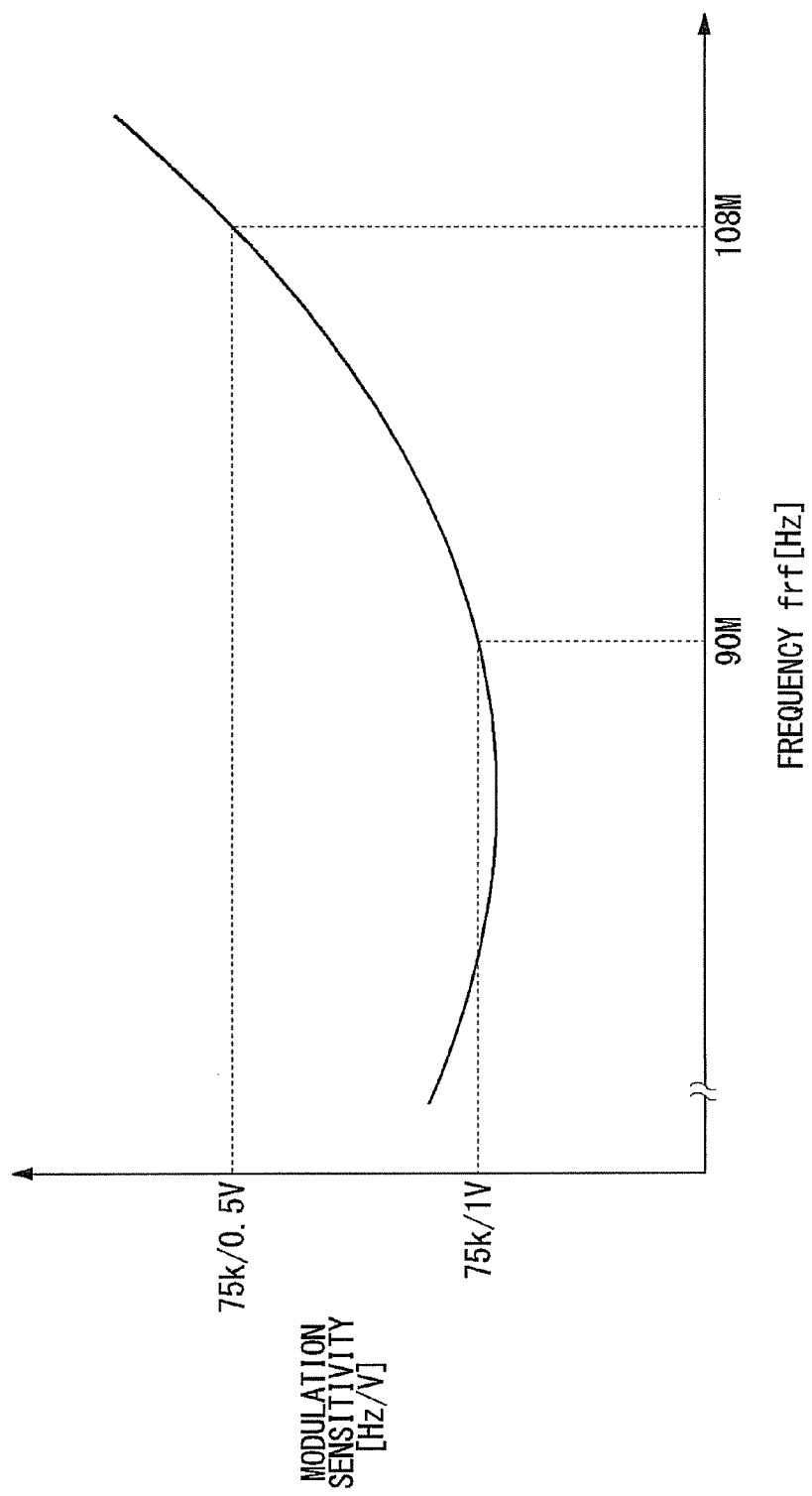

FIG. 11 shows an example of modulation sensitivity characteristic of the frequency modulator 3100 using the VCO 3012 shown in FIG. 10. In FIG. 11, the horizontal axis indicates the frequency of the modulated signal (modulation frequency) and the vertical axis indicates the modulation sensitivity. The characteristic and numerical values shown in FIG. 11 are just examples, and the actual characteristic changes depending to the configuration of the frequency modulator 3100 or the like. As shown in FIG. 11, the modulation sensitivity of the frequency modulator 3100 changes according to the modulation frequency frf.

FIG. 12 shows a relationship between the gain g of the variable gain amplifier 3110 set by the control unit 3120 and the modulation frequency frf. In FIG. 12, the horizontal axis indicates the frequency frf of the modulated signal and the vertical axis indicates the gain g of the variable gain amplifier 3110. As shown in FIG. 12, the control unit 3120 sets the gain of the variable gain amplifier 3110 to correct the frequency dependency of the modulation sensitivity of the frequency modulator 3100. That is, the control unit reduces the gain g of the variable gain amplifier 3110 at a frequency that the modulation sensitivity of the frequency modulator 3100 is high, and increases the gain of the variable gain amplifier 3110 at a frequency that the modulation sensitivity of the frequency modulator 3100 is low.

For example, the frequency dependency of the modulation sensitivity of the frequency modulator 3100 has been measured in advance, and the relationship between the gain and the frequency shown in FIG. 12 is determined based on the measured dependency. The control unit 3120 may include a memory 3122 that stores a table showing the relationship between the gain and the frequency.

Thus, the degree of modulation can be kept at constant independently to the frequency by changing the gain of the variable gain amplifier 3110 according to the modulation frequency of the frequency modulator 3100, therefore a good modulating signal can be generated in a wide frequency band.

Furthermore, the control unit 3120 changes the gain of the power amplifier 3204 according to the modulation frequency. FIG. 13 shows a relationship between the output power and the frequency of the FM transmitter 3200. The solid line of FIG. 13 shows the relationship when the gain of the power amplifier 3204 is fixed. Generally, the gain of the power amplifier has frequency dependency and the output power has frequency dependency due to the radiation characteristic of an antenna and filters (not shown) provided between the respective circuits. Consequently, in some cases, depending on frequencies, it is impossible to transmit sufficiently high power. Since the upper limit of the power at which the transmission from the FM transmitter 3200 is acceptable is regulated in the Radio Law, it is also impossible to increase the gain of the power amplifier 3204.

Accordingly, in the FM transmitter 3200 according to the embodiment, the control unit 3120 sets the gain of the power amplifier 3204 depending on the frequency of the modulated signal so that the power of the frequency signal output from the power amplifier 3204 may be constant. The broken line of FIG. 13 shows the relationship between the output power and the frequency when the gain of the power amplifier 3204 is controlled. The relationship between the output power of the FM transmitter 3200 and the frequency may be measured in advance, and a table showing the relationship between the gain of the power amplifier 3204 and the frequency may be set and stored in the memory 3122.

By performing the gain control of the power amplifier 3204, the transmission power of the FM transmitter 3200 can be kept at constant even when the frequency of the modulated signal changes.

It would be understood by the person skilled in the art that the embodiment is just for illustration and various modifications of combinations of the respective component elements and the respective processing processes, and the modifications are within the scope of the invention.

Although the variable gain amplifier 3110 is provided upstream of the frequency modulator 3100 in the third embodiment, when the frequency modulator 3100 has the configuration in FIG. 10, at least one of the first resistor R31 and the second resistor R32 may be a variable resistor, and the frequency modulator 3100 and the variable gain amplifier 3110 may be integrally configured. In this case, the circuit area can be reduced.

Fourth Embodiment

FIG. 14 is a circuit diagram showing a configuration of a voltage generating circuit (bias circuit) 5100 according to the fourth embodiment of the invention. The voltage generating circuit 5100 divides a power supply voltage Vdd applied to a power supply terminal 5102 and a ground voltage (0V) applied to a ground terminal GND and outputs a divided voltage from an output terminal 5104. In the embodiment, the voltage generating circuit 5100 generates a midpoint voltage Vdd/2 of the power supply voltage.

The voltage generating circuit 5100 includes a first voltage divider circuit 5010, a second divider circuit 5020, and a charging circuit 5030. The first voltage divider circuit 5010 includes a first resistor R51 and a second resistor R52 connected in series between the power supply terminal 5102 and the ground terminal GND. In the embodiment, the first resistor R51 and the second resistor R52 are formed by pairing and the resistances thereof are designed equal. It is desirable that the resistances of the first resistor R51 and the second resistor R52 are set large for reducing electric current consumption, and set within a range from several tens of kilo ohms to 1 mega ohms, for example.

The connection point between the first resistor R51 and the second resistor R52 is connected to the output terminal 5104. An output capacitor C51 is provided between the output terminal 5104 and the ground terminal GND. The voltage generating circuit 5100 outputs a voltage appearing in the output capacitor C51 (hereinafter, referred to as a reference voltage Vref) from the output terminal 5104. For stabilization of the reference voltage Vref, it is desirable that the capacitance of the output capacitor C51 is larger, and preferably set in a range from 0.01 µF to 1 µF.

The second divider circuit 5020 includes a third resistor R53 and a fourth resistor R54 connected in series between the power supply terminal 5102 and the ground terminal GND. In the embodiment, the third resistor R53 and the fourth resistor R54 are formed by pairing and the resistances thereof are designed equal. It is desirable that the resistances of the third resistor R53 and the fourth resistor R54 are set large for reducing electric current consumption, and set within a range from several tens of kilo ohms to 1 mega ohms, for example. Note that all of the first resistor R51 to the fourth resistor R54 may be set to the same resistances and all of them may be configured by pairing.

The charging circuit 5030 compares a voltage at the connecting point between the third resistor R53 and the fourth resistor R54 (hereinafter, referred to as a detected voltage Vdet) with the reference voltage Vref of the output terminal 5104, and becomes active when Vdet>Vref and inactive when Vdet<Vref. The charging circuit 5030 supplies charging current Ic1 to the output capacitor C51 when active and stops the current supply when inactive.

The charging circuit 5030 includes a fifth resistor R55, a first switch SW51, and a first comparator 5032. The fifth resistor R55 and the first switch SW51 are connected in series between the power supply terminal 5102 and the output terminal 5104. The first comparator 5032 compares the detected voltage Vdet with the reference voltage Vref of the output terminal 5104. The first switch SW51 is turned on and off depending on the output signal from the first comparator 5302. That is, the first switch SW51 is turned on when Vdet>Vref and turned off when Vdef<Vref. The charging circuit 5030 becomes active when the first switch SW51 is on and inactive when the first switch SW51 is off. The first switch SW51 may be configured using a MOS transistor or bipolar transistor.

It is desirable that the resistance of the fifth resistor R55 is set in a range from 1/1000 times to 1/10 times the resistances of the first resistor R51 to the fourth resistor R54. For example, when the first resistor R51 to the fourth resistor R54 are set to 500 kΩ, the fifth resistor R55 is set to about 1 kΩ.

In the embodiment, it is desirable that the first comparator 5032 has an input offset voltage Vofs1. The value of the input offset voltage Vofs1 is preferably set about from several tens of millivolts to several hundreds of millivolts, more specifically, to about 10 mV to 300 mV. When the input offset voltage Vofs1 is set for the first comparator 5032, the first switch SW51 is turned on when Vdet>Vref+Vofs1 and turned off when Vdet<Vref+Vofs1.

According to the above configured voltage generating circuit 5100, in the steady state, the reference voltage given by Vref=Vdd×R52/(R51+R52)=Vdd/2 is generated from the output terminal 5104. The reference voltage Vref output from the output terminal 5104 is supplied via buffer circuits BUF1, BUF2 to other circuit blocks.

An operation of the above configured voltage generating circuit 5100 when the power supply voltage varies will be described. Hereinafter, as an example of variation of power supply voltage, the case where the power supply voltage rises will be explained.

First, to make the effect of the invention clearer, an operation when the charging circuit 5030 is not provided will be described. FIG. 15 is an operation waveform chart when the charging circuit 5030 is not provided. FIG. 15 and FIG. 16, which will be described later, show waveforms while appropriately scaling the vertical axis and the horizontal axis.

When the power is turned on at time t0, the power supply voltage Vdd rises and reaches a predetermined voltage Vdd1 at time t1. When the charging circuit 5030 is not provided, the charging path to the output capacitor C51 is only the first resistor R51. Here, the output capacitor C51 and the first resistor R51 form a time constant circuit, and, as described above, the capacitance of the output capacitor C51 is set large for stabilization of the voltage and the resistance of the first resistor R51 is also set large for low power consumption. Accordingly, the time constant of the output capacitor C51 and the first resistor R51 becomes very large, and the rising of the reference voltage Vref rises later than the power supply voltage Vdd and reaches a predetermined voltage Vdd1/2 at time t2 as shown in FIG. 15.

Next, an operation of the voltage generating circuit 5100 provided with the charging circuit 5030 according to the embodiment will be described. FIG. 16 is an operation waveform chart of the voltage generating circuit 5100 provided with the charging circuit 5030 according to the embodiment.

When the power supply voltage Vdd rises, the detected voltage Vdet obtained by dividing the power supply voltage Vdd rises following the power supply voltage Vdd. At time t0, Vdet<Vref+Vofs1 holds and therefore the charging circuit 5030 is inactive. In this case, the output capacitor C51 is charged via the first resistor R51, and the reference voltage Vref starts to gradually rise.

Vdet>Vref+Vofs1 holds at time t1, the first switch SW51 is turned on and the charging circuit 5030 becomes active. When the charging circuit 5030 becomes active, the output capacitor C51 is charged through the path including the first resistor R51 and the fifth resistor R55. As described above, since the resistance of the fifth resistor R55 is set lower compared to the resistance of the first resistor R51, the time constant becomes lower and the reference voltage Vref starts to rapidly rise.

When the power supply voltage Vdd reaches the predetermined voltage Vdd1 at time t2, then, the reference voltage Vdet reaches a voltage (Vdd1/2−Vofs1) at time t3, Vdet<Vref+Vofs1 holds and the first switch SW51 is turned off. After the time t3, the output capacitor C51 is charged by the first resistor R51, and the reference voltage Vref gradually rises and reaches Vdd1/2 at time t4.

Thus, with the voltage generating circuit 5100 according to the embodiment, when the power supply voltage Vdd rises, the rising of the reference voltage Vref at the output terminal 5104 delays from the rising of the detected voltage Vdet that follows the power supply voltage Vdd, and therefore, the charging circuit 5030 becomes active. Charging is performed through the fifth resistor R55 having the low resistance by turning on the first switch SW51, and thereby, the reference voltage Vref is raised in a shorter time compared to the case of charging only with the first resistor R51.

Further, when the input offset voltage Vofs1 is set for the first comparator 5032 of the charging circuit 5030, switching between on and off of the first switch SW51 of the charging circuit 5030 due to slight variations of the power supply voltage Vdd and the reference voltage Vref can be prevented. Especially, turning on and off of the first switch SW51 repeatedly due to the ripple of the power supply voltage Vdd can be prevented and the reference voltage Vref can be further stabilized.

Furthermore, the charging circuit 5030 becomes active when Vdet>Vref (Vdet>Vref+Vofs1, if the offset voltage is set) holds even if the difference between the detected voltage and the reference voltage Vref becomes small, and therefore, the reference voltage Vref can be raised by the charging circuit 5030 until the reference voltage Vref becomes nearly equal to the midpoint voltage Vdd/2 of the power supply voltage Vdd.

Next, a modified example of the voltage generating circuit will be described. FIG. 17 is a circuit diagram showing a configuration of the modified example of the voltage generating circuit 5100. In FIG. 17, the same signs are assigned to the same or similar component elements as those in FIG. 14, and the description will not be repeated. Hereinafter, the example will be described while focusing on the differences.

The voltage generating circuit 5100b in FIG. 17 is characterized in that a discharging circuit 5040 is added to the voltage generating circuit 5100 in FIG. 14. The discharging circuit 5040 becomes active and draws current from the output capacitor C51 when the detected voltage appearing at the connecting point between the third resistor R53 and the fourth resistor R54 is lower than the reference voltage Vref appearing at the output terminal 5104.

The discharging circuit 5040 is configured similarly to the charging circuit 5030. The discharging circuit 5040 includes a sixth resistor R56, a second switch SW52, and a second comparator 5042.

The sixth resistor R56 and the second switch SW52 are connected in series between the ground terminal GND and the output terminal 5104. The second comparator 5042 compares the detected voltage Vdet appearing at the connection point between the third resistor R53 and the fourth resistor R54 with the reference voltage Vref of the output terminal 5104. On and off of the second switch SW52 is controlled according to the output signal from the second comparator 5042. The second comparator 5042 may have an input offset voltage Vofs2.

When the input offset voltage Vofs2 is set for the second comparator 5042, the second switch SW52 is turned on when Vdet<Vref−Vofs holds and turned off when Vdet>Vref−Vofs holds.

It is desirable that the resistance of the sixth resistor R56 is set in a range from 1/1000 times to 1/10 times the resistances of the first resistor R51 to the fourth resistor R54. Further, the resistances of the sixth resistor R56 and the fifth resistor R55 may be set equal and formed by pairing.

Since the discharging circuit 5040 is provided in addition to the charging circuit 5030, the reference voltage Vref can be immediately reduced when the voltage generating circuit 5100b is stopped.

Further, by setting the input offset voltages of the first comparator 5032 and the second comparator 5042, the first switch SW51 and the second switch SW52 can be prevented from being turned on and off alternatively in the voltage range where the reference voltage Vref and the detected voltage Vdet are nearly equal.

FIG. 18 is a block diagram showing a configuration example of a signal processing circuit utilizing the voltage generating circuit 5100 according to the above described embodiment. The signal processing circuit 5200 in FIG. 18 performs predetermined signal processing using the midpoint voltage Vdd/2 output from the voltage generating circuit 5100 as a reference voltage. The predetermined signal processing includes amplification of audio signal, filtering by an active filter, for an example.

Hereinafter, the signal processing circuit 5200 in FIG. 18 will be described as a stereo FM transmission circuit that converts an audio signal into a stereo composite signal, performs frequency modulation, amplifies, and then output the resultant signal from an antenna. Such a signal processing circuit (hereinafter, also referred to an FM transmission circuit) 5200 may be used when a signal is transmitted without a cable in an in-car audio system, or built-in in a portable terminal for use in transmission an audio signal to stationary audio equipment.

The FM transmission circuit 5200 includes the voltage generating circuit 5100, preemphasis filters 5110L, 5110R, a stereo modulator 5120, a frequency modulator 5130, and a power amplifier 5140. In the FM transmission circuit 5200, the respective blocks may be integrated in one LSI or may be divided in separate ICs. In FIG. 14, only the main blocks of the FM transmission circuit 5200 are simplistically shown and other circuit blocks such as filters are not shown.

An audio signal source 5210 is a CD player, an MD player, a memory audio system, a disk audio system, or the like and generates an audio signal S51 and outputs it to the FM transmission circuit 5200. The preemphasis filters 5110L, 5110R perform frequency correction on audio signals S51L, S51R corresponding to the L-channel and the R-channel of the stereo signal, respectively, and output them to the stereo modulator 5120. The stereo modulator 5120 converts the audio signals SL, SR output from the preemphasis filters 5110L, 5110R into a stereo composite signal Sc. The stereo composite signal Sc is input to the frequency modulator 5130.

The frequency modulator 5130 uses the stereo composite signal Sc as a modulating signal and generates a high-frequency-modulated signal S53 frequency-modulated based on the modulating signal. The frequency modulator 5130 is a direct-modulation frequency modulator that includes a PLL (Phase Locked Loop) configured using a VCO, a frequency divider, a phase comparator, and a loop filter and multiplexes an audio signal with an input signal to the VCO. The modulated signal S53 generated by the frequency modulator 5130 is amplified by the power amplifier 5140 and transmitted from an antenna 5220.

The voltage generating circuit 5100 uses a battery voltage Vbat output from a battery 5230 as a power supply voltage Vdd, and generates a reference voltage Vref based on the power supply voltage Vdd. The battery voltage Vdd is supplied not only to the voltage generating circuit 5100 but also to the respective blocks. The reference voltage Vref generated by the voltage generating circuit 5100 is output to the respective blocks that require the midpoint voltage Vdd/2 of the power supply voltage Vdd such as the preemphasis filters 5110, the stereo modulator 5120, the frequency modulator 5130, and other amplifiers via the buffers BUF1 to BUF3.

That is, it is desirable that at least one of the stereo modulator 5120 and the frequency modulator 5130 operates based on the midpoint voltage Vdd output from the voltage generating circuit 5100.

In the above configured FM transmission circuit 5200 in FIG. 18, since the midpoint voltage Vdd/2 can be generated in a short period after the power is turned on by the voltage generating circuit 5100 according to the embodiment, the time period until the start of signal processing can be shortened.

It would be understood by the person skilled in the art that the embodiment is just for illustration and various modifications of combinations of the respective component elements and the respective processing processes, and the modifications are within the scope of the invention.

In the voltage generating circuit 5100 according to the fourth embodiment, the fifth resistor R55 or the sixth resistor R56 is provided on the charging or discharging path of the charging circuit 5030 or the discharging circuit 5040, however, the configuration is not limited to that. For example, fifth resistor R55 or the sixth resistor R56 may not be provided in the charging circuit 5030 or the discharging circuit 5040.

The case where the FM transmission circuit 5200 in FIG. 18 is driven by a battery has been described, however, the configuration is not limited to that, the circuit may be driven by a voltage output from another power supply unit. Further, the application of the voltage generating circuit 5100 according to the fourth embodiment is not limited to the audio signal processing circuit, but widely used for other signal processing circuits using the midpoint voltage Vdd/2.

The voltage generating circuit 5100 is for dividing the power supply voltage Vdd and the ground potential, however, the ground potential is not limited to 0 V, but can be a negative power supply voltage −Vdd.

While the preferred embodiments of the present invention have been described using specific terms, such description is for illustrative purposes only, and it is to be understood that changes and variations may be made without departing from the spirit or scope of the appended claims.

What is claimed is:

1. A stereo modulator which generates a stereo composite signal based on a stereo signal, a subcarrier wave, and a pilot signal, the stereo modulator comprising:
    a separation adjustment circuit which includes a delay circuit that delays an input signal by the time length, in which a predetermined clock signal is counted for n cycle(s) (n is a counting number), and inputs one of the subcarrier wave and the pilot signal to the delay circuit to be delayed;
    a multiplexer which multiplexes the subcarrier wave output from the separation adjustment circuit and the stereo signal; and
    a pilot signal multiplexing unit which multiplexes the pilot signal output from the separation adjustment circuit and an output signal from the multiplexer.

2. The stereo modulator according to claim 1, wherein the number of cycles n counted by the delay circuit of the separation adjustment circuit is externally controllable.

3. The stereo modulator according to claim 1, wherein the delay circuit of the separation adjustment circuit includes a first shift register that operates according to a clock signal, and outputs a signal n-bit shifted by the first shift register.

4. The stereo modulator according to claim 1, wherein the delay circuit of the separation adjustment circuit includes:
    a first shift register capable of shifting m bits at the maximum (m is an integral number that satisfies m≧n); and
    a selecting unit which selects an n-bit shifted signal from the first shift register and outputs the signal.

5. The stereo modulator according to claim 1, wherein the separation adjustment circuit further includes a switch which switches either one of the subcarrier wave and the pilot signal is input to the delay circuit.

6. The stereo modulator according to claim 3, wherein the separation adjustment circuit further includes a one-bit second shift register which delays an input signal by one clock cycle of the clock signal, and inputs the other of the subcarrier wave and the pilot signal to the second shift register to be delayed.

7. The stereo modulator according to claim 6, wherein the separation adjustment circuit further includes a switch which switches either one of the subcarrier wave and the pilot signal is input to the first shift register and the second shift register, respectively.

8. The stereo modulator according to claim 1, wherein the clock signal is a signal that shares the common origin with a reference clock signal used for generating the subcarrier wave and the pilot signal.

9. The stereo modulator according to claim 1, wherein the stereo modulator is integrated on a single semiconductor substrate.

10. An FM transmission circuit comprising:
    the stereo modulator according to claim 1, which converts an audio signal into a stereo composite signal;
    a frequency modulator which outputs a modulated signal frequency-modulated using the stereo composite signal output from the stereo modulator; and
    a power amplifier which amplifies the modulated signal generated by the frequency modulator.

11. The FM transmission circuit according to claim 10, wherein the stereo modulator, the frequency modulator, and the power amplifier are integrated on a single semiconductor substrate.

* * * * *